(12) United States Patent
Imai

(10) Patent No.: US 6,590,224 B2
(45) Date of Patent: Jul. 8, 2003

(54) IMAGE STORAGE MEDIUM AND METHOD OF MANUFACTURING THE SAME

(75) Inventor: Shinji Imai, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/814,093

(22) Filed: Mar. 22, 2001

(65) Prior Publication Data

US 2001/0025938 A1 Oct. 4, 2001

(30) Foreign Application Priority Data

Mar. 22, 2000 (JP) ........................................ 2000-080487

(51) Int. Cl.$^7$ ............................................. G01N 23/04
(52) U.S. Cl. ........................................ 250/591; 250/580
(58) Field of Search ........................... 250/591, 580, 250/370.08, 370.09; 378/28, 31

(56) References Cited

U.S. PATENT DOCUMENTS

| | | | |
|---|---|---|---|
| 4,176,275 A | 11/1979 | Korn et al. .................. | 250/213 |
| 4,535,468 A | 8/1985 | Kempter ...................... | 378/31 |
| 4,961,209 A | 10/1990 | Rowlands et al. ............ | 378/29 |
| 5,268,569 A | 12/1993 | Nelson et al. ............... | 250/214 |
| 5,354,982 A | 10/1994 | Nelson et al. ............... | 250/314 |
| 5,880,472 A | * 3/1999 | Polischuk et al. ..... | 250/370.09 |
| 5,925,890 A | 7/1999 | Van Den Bogaert et al. .... | 250/580 |

FOREIGN PATENT DOCUMENTS

| | | | |
|---|---|---|---|
| EP | 0898421 | 2/1999 | ............ H04N/5/30 |
| EP | 1041400 | 10/2000 | ............. G01T/1/24 |
| JP | 9-5906 | 1/1997 | ........... G03B/43/02 |
| JP | 10-232824 | 9/1998 | ........... G06F/12/06 |
| JP | 2000-284056 | 10/2000 | ............. G01T/1/24 |

OTHER PUBLICATIONS

Rowlands et al., "X–ray Imaging using amorphous selenium: Photoinduced discharge (PID) readout for digital general radiography," Med. Phys., vol. 22, No. 12, Dec. 1995, pp. 1983–1996.

Author Unknown, "Method and device for recording and transducing an electromagnetic energy pattern," Research Disclosure, No. 23027, pp. 229–231. Jun. 1983.

* cited by examiner

Primary Examiner—Constantine Hannaher
Assistant Examiner—Timothy Moran
(74) Attorney, Agent, or Firm—Sughrue Mion, PLLC

(57) ABSTRACT

An electrostatic recording medium having a support body on which line-shaped electrodes are formed, and on which a blocking layer formed of a thin film is provided, and the deterioration of the blocking performance of the blocking layer is prevented. After an electrode layer, composed of a layer of film, is formed on the support body, etching is performed and stripe electrodes are formed. The member on which the line-shaped electrodes have been formed is dipped along its lengthwise direction into and pulled up and out of a vessel filled with blocking layer forming liquid to form the film of the blocking layer. In this way, a continuous blocking layer is formed so as to cover the top and side surfaces continuously of each electrode, whereby dark current flow from the stripe electrodes can be prevented with certainty.

18 Claims, 10 Drawing Sheets

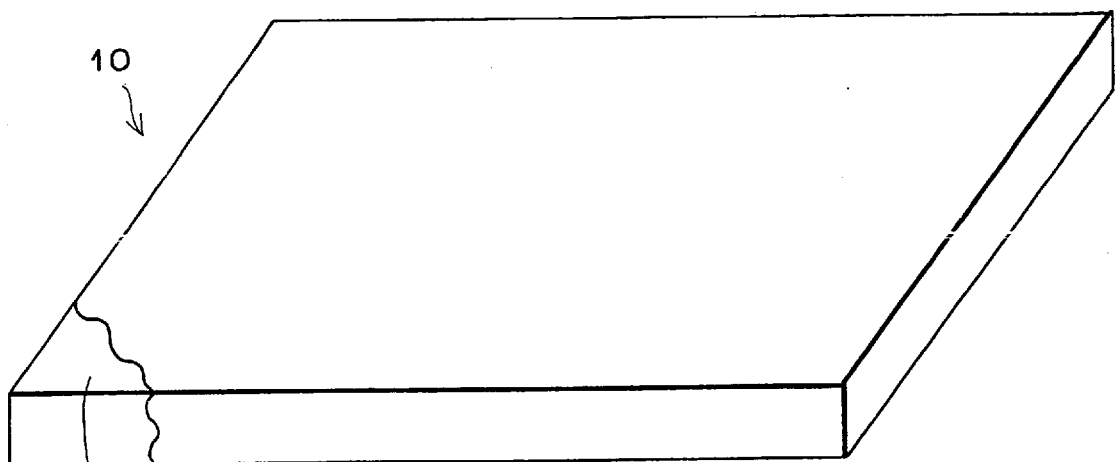
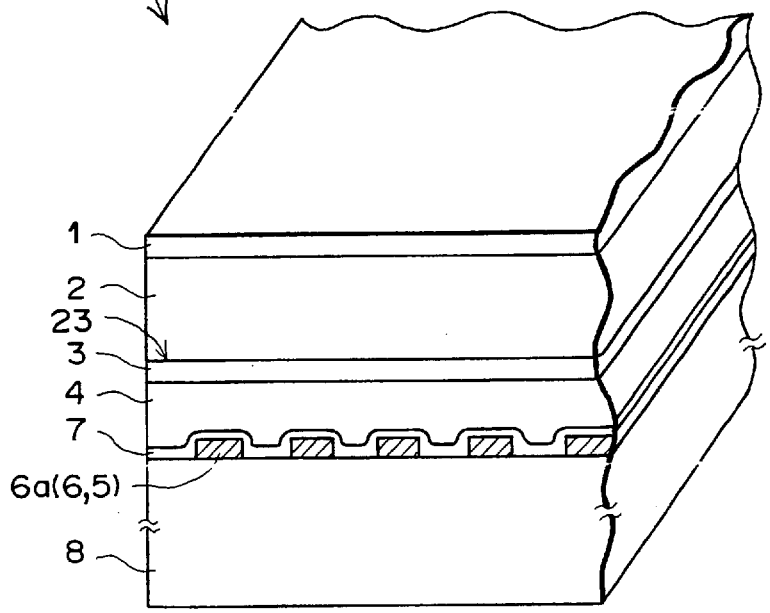

F I G. 4A
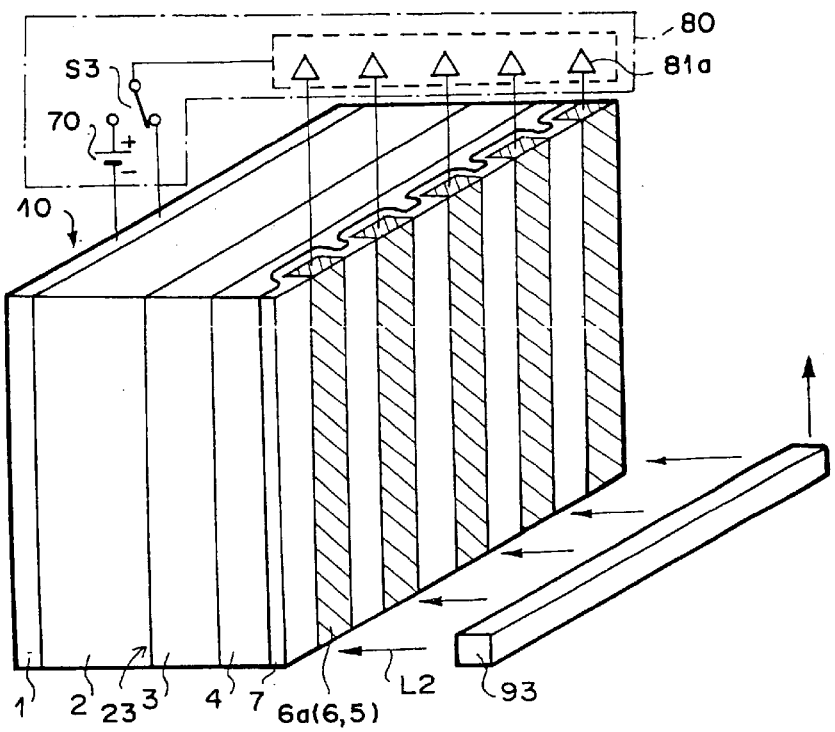
F I G. 4B
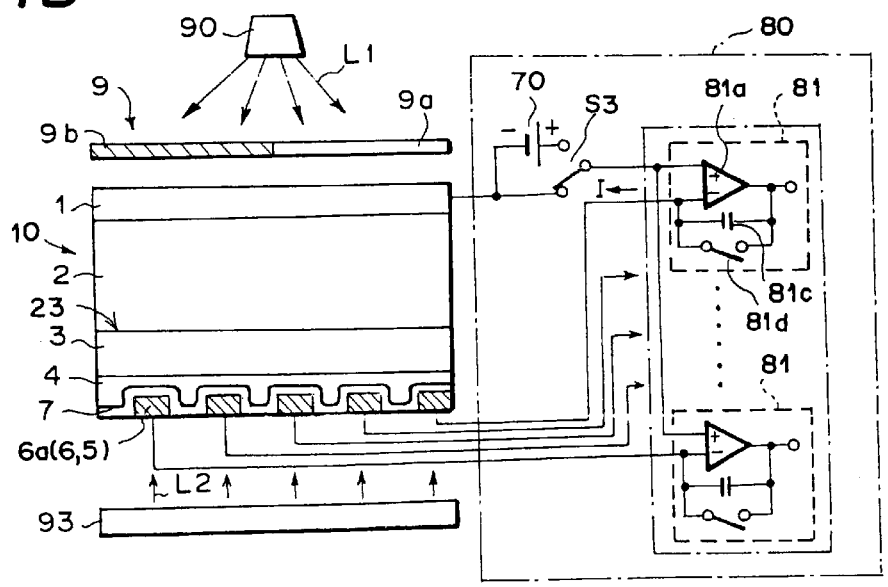

IMAGE STORAGE MEDIUM AND METHOD OF MANUFACTURING THE SAME

BACKGROUND OF THE INVENTION

1. Field of the Invention

The present invention relates to an image storage medium capable of storing image data in the form of an electrostatic latent image, and a method of manufacturing the same.

2. Description of the Related Art

There have been known, in the field of medical X-ray radiology, for example, image recording mediums, on which an electrostatic latent image is recorded by the passing therethrough of X-rays, employing photoconductors sensitive to X-rays (such as selenium, etc.) in order to reduce the quantity of X-ray energy a subject is bombarded with, and to improved diagnostic performance; afterwards, systems for reading out such electrostatic latent images have been disclosed (as in for example: U.S. Pat. Nos. 4,176,275, 5,268,569, 5,354,982, 4,535,468, 4,961,209; "23027 Method and devise for recording and transducing an electromagnetic energy pattern", Research Disclosure June 1983; Japanese Unexamined Patent Publication No. 9(1997)-5906; "X-ray imaging using amorphous selenium", Med Phys. 22(12), etc.) More specifically, in U.S. Pat. No. 4,535,468, for example, an image storage medium comprising a relatively thick 2 mm Al, etc. electrode layer on the recording side, which serves as an electrically conductive substrate transparent to the radiation which is to serve as the electromagnetic energy (hereafter also referred to as recording light) to be recorded thereon, on which are formed a 100–500 $\mu$m thick recording photoconductive layer having a-Se (amorphous selenium) as a main component, a 0.1–10.0 $\mu$m thick middle storage portion (trap layer) formed of $AsS_4$, $As^2 S_3$, $As_2Se_3$, etc. for trapping the latent-image charge carriers generated within the recording-use photoconductive layer, a 0.5–100 $\mu$m thick readout photoconductive layer having of a-Se as a main component, and a 100 $\mu$m thick, readout-side electrode layer, which is transparent to the readout electromagnetic radiation (hereinafter also referred to as readout light) and is formed of Au or ITO (Indium Tin Oxide), superposed one on another in that order, is disclosed. Further, in particular, it is advantageous that the favorable hole mobility of the a-Se can be put to use in employing the readout side photoconductor as the positive electrode, and in order to prevent a deterioration of the S/N ratio upon direct injection of charges from the electrodes, an apparatus wherein a blocking layer formed of an organic material is disposed between the readout-side electrode layer and the readout photoconductive layer has been disclosed. That is, this image storage medium is a multi-layer recording medium, which has great dark resistance and readout responsiveness, and is comprised, overall, of a layer formed mainly of a-Se.

Here, to improve the image S/N ratio, because it has been proposed to shorten the readout time required to perform line readout (primarily in the main scanning direction), in which the electrodes of the readout photoconductive layer comprise many elements (straight line-shaped) aligned with the pixel pitch to form stripe-shaped electrodes (as in for example, Japanese Patent Application No. 10 (1998)-232824, by the same author as that of the current application). However, in the storage portion formation of the image storage medium disclosed in aforementioned U.S. Pat. No. 4,535,468, in the final manufacturing process thereof, the readout-use light side electrode layer must be formed after the readout-use photoconductive layer has been formed, making it difficult to form aforementioned stripe electrodes. To form these stripe electrodes, fine processing of the electrodes must be performed using the photo-etching technique employed in the manufacture of semiconductors. In this process, a high temperature (for example, 200° C.) is normally required for the process of baking the photo-resist etc., however, the a-Se of the already formed photoconductive layer is not capable of tolerating such high temperatures, and the characteristics thereof are thereby deteriorated.

In addition, if the alkaline developing agent used in the photo-resist developing processes is brought into contact with the a-Se, a harmful gas is produced, and complicated processes are necessary to circumvent the occurrence thereof, whereby prohibitively high costs are incurred.

On the one hand, the applicant of the current application has proposed, in Japanese Patent Application 10(1998)-232824, an image storage medium (static-electricity recording medium) comprising a recording-light side electrode layer, which is transparent to the radiation that is the recording light, formed of $SnO_2$ (Nesa film), a 50–1000 $\mu$m thick recording photoconductive layer formed mainly of a-Se, a charge transport layer formed of a-Se, etc. doped with 10–200 ppm of an organic material or chlorine (Cl), for forming at the interface with aforementioned recording photoconductive layer a storage portion that stores the latent-image charge emitted by the recording photoconductive layer, a readout-use photoconductive layer having a-Se as a main component thereof, and a readout-side electrode layer that is transparent to readout light, disposed in that order.

When manufacturing this image storage medium, no definite order in which the layers should be formed has been explicitly stated, and acceptable results have been obtained by forming the layers in the order starting with the recording-side electrode layer, or in the reverse order thereof. However, as the readout-side electrode layer, a Nesa film or other electrical conductor has been provided on a transparent glass support panel, which is used as the positive electrode and has highly fine "comb teeth at a pitch corresponding to the pitch of the pixels" and "formed using semiconductor production technology that forms the comb teeth having a sufficiently narrow interspace". That is to say, the electrodes of the readout-light side electrode layer are provided as stripe electrodes arranged at intervals corresponding to the pitch of the pixels. In this case, at first, the stripe electrodes are formed on the transparent glass substrate by a photo-etching process, etc., after which the readout photoconductive layer through the recording-side electrode layer are formed in that order. Note that although a value for the pixel pitch has not been given directly, because in medical-use X-ray radiology a high S/N ratio is possible while maintaining image sharpness, the use of a pixel pitch of 50–200 $\mu$m is readily apparent to those skilled in the art.

In addition, in Japanese Patent Application 10 (1998)-232824, in the same way as described in aforementioned U.S. Pat. No. 4,535,468, by providing an approximately 500 Å blocking layer formed of an inorganic material such as $CeO_2$ between the readout-light side electrode layer and the readout-use photoconductive layer, deterioration of the S/N ratio by the direct injection of positive charges into the readout-side electrode layer is prevented.

On the other had, afterwards, in further discussions the developers of the invention of the present application found the following points regarding the image storage medium of aforementioned Japanese Patent Application 10(1998)-232824:

1) When carrying out manufacture thereof, after forming a comparatively thin 50–200 nm thick film of ITO on the transparent glass layer, it has been possible to adequately form stable, highly fine stripe electrodes of the readout-side electrode layer.
2) Forming the recording photoconductive layer of a-Se at a thickness of 50–1000 μm provides for excellent dark resistance.
3) As the charge transport layer, a stacked layer type comprising a first hole transport layer composed of a thin layer of organic material 0.1–1.0 μm thick forming the condenser onto which electrons are placed, and a second, high-speed hole transport layer, formed of 5–30 μm thick "a-Se doped with 10–200 ppm of CL", which has few hole traps, superposed one on the other, offers excellent readout responsiveness and after-image formation characteristics.
4) Forming the readout photoconductor of 0.05–0.5 μm a-Se provides for excellent dark resistance.
5) If the charge transport layer is a stacked layer-type hole transport layer comprising a first charge transport layer formed of a 0.1–1 μm layer of PVK or TPD, etc. and a second charge transport layer formed of a 5–30 μm layer of a-Se doped with 10–200 ppm of CL, because the first charge layer attains strong insulation properties with respect to the polarized charge of the latent image, and the second charge transport layer attains high-speed transportability of the polarized transport charges, excellent readout responsiveness and after-image formation characteristics are provided, and although the ideal charge transport layer can be obtained, if a 5–30 μm thick layer of a-Se is used instead in aforementioned second hole transport layer, as a comparatively advantageous result, a structure combining the readout photoconductive layer is obtained, and manufacture thereof is simplified.

From the above, the image storage medium disclosed in Japanese Patent Application No. 10(1998)-232824 is seen to be a multi-layered storage medium offering great dark resistance and high-speed readout responsiveness, and which is preferably formed, overall, of one layer having a-Se as the main component.

Also, in Japanese Unexamined Patent Publication No. 2000-284056, the applicant of the present application has proposed an image storage medium capable of providing a level of improvement in performance over the image storage medium disclosed in Japanese Patent Application 10(1998)-232824. The image storage medium disclosed in Japanese Unexamined Patent Publication 2000-284056 comprises a photoconductive member formed between within the readout-side electrode layer or between the recording-side electrode layer and the readout-side electrode layer, for outputting an electrical signal of a level corresponding to the quantity of the charge of the latent image charge stored in the storage portion formed between the readout photoconductive layer and the recording photoconductive layer.

The conducting member can be of any shape, however, it is desirable that the shape thereof be such that it does not affect the process of forming the latent image (movement of latent image charges, storage) when recording, or the process of recoupling the charges when reading, that is, the latent image charge and the reverse charge thereto, the transport charge. For example, for cases in which the conducting member is formed within the recording photoconductive layer or on the surface of the readout photoconductive layer side of the recording photoconductive layer, it is desirable that the photoconducting member be of a shape that does not interfere with the movement to the condenser of the latent image charge generated within the recording photoconductive layer. Further, for cases in which the photoconducting member is formed within the readout photoconductive layer, the charge transport layer or the trap layer, it is desirable that the conducting member be of a shape that does not interfere with the movement to the condenser of the transport charge generated within the readout photoconductive layer. Therefore, holes of a desired square, round, etc. shape can be provided corresponding to the pixels, or a continuous long hole provided along the direction in which the pixels are lined up can be provided.

In addition, for cases in which aforementioned conducting member is disposed within the readout photoconductive layer, it is desirable that the conducting member be transparent to the recording radiation or the radiation for stimulating the recording radiation, be capable of adequately injecting radiation, etc. into the recording photoconductive layer, and not affect the process whereby charges are generated within the photoconducting layer.

Further, an image storage member has been proposed structured so that the readout electrode layer is a stripe electrode comprising a plurality of line-shaped electrodes, aforementioned conducting member is being formed inside the readout electrode layer and is a sub-stripe electrode comprising a plurality of line-shaped electrodes, and aforementioned stripe and sub-stripe electrodes are disposed alternating and substantially parallel within the readout electrode layer. Further, for cases in which an image storage medium comprises a single electrode formed of a single line of pixels, or a plurality of aforementioned stripe and sub-stripe electrodes, when formed of a plurality of stripe and sub-stripe electrodes, an image storage medium in which the stripe electrodes are of a width more narrow than those of the image storage medium disclosed in aforementioned Japanese Patent Application 10(1998)-232824 has been proposed.

Here, for cases in which the electrodes of the readout electrode layer are stripe electrodes and a blocking layer is provided, normally, after formation of a transparent oxidized film (such as thin film ITO), each element is formed disposed along the pixel pitch by etching, and a blocking layer is superposed thereon by resistance heating vacuum deposition of a film of $CeO_2$.

In this case, because a surface-step is caused between the elements and the transparent glass substrate, the blocking layer is does not cover the side surface of the elements in the lengthwise direction, and the performance of the blocking layer is deteriorated by the injection of a dark current from the side surface of the elements, whereby a problem arises in that the S/N ratio is lowered.

To lower the lengthwise resistance (line resistance) of aforementioned transparent oxidized film of which the elements are formed, there is a method of making it comparatively thick (for example, at a 2000 A thickness), however, as the elements increase in thickness so does aforementioned surface-step, and the deterioration of the performance of the blocking layer becomes conspicuously noticeable.

In addition, for cases in which the readout photoconductive layer comprises aforementioned stripe and sub-stripe electrodes alternating and substantially parallel, a black noise current is produced by the sub-stripe electrodes as well, because this is stored in the condenser as offset noise and becomes a cause of deterioration of the S/N ratio, it is necessary to provide a blocking layer for the sub-stripe electrodes as well. Further, in this case as well, as described above, deterioration in the performance of the blocking layer occurs due to surface-step, and because of the fine pitch owed to the narrowness of the stripe and sub-stripe electrodes, the deterioration is conspicuous. Still further, because it is necessary to provide the sub-stripe electrodes with a cutoff property with respect to the readout light, there are cases in which the electrodes have a greater thickness than that at the time of production thereof, and if the thickness is greater than the thickness of the stripe electrodes (for example, a case in which the stripe electrodes are 0.1 μm thick and the sub-stripe electrodes are 1 μm thick), due to aforementioned surface-step, the deterioration of the performance of the blocking layer becomes even more conspicuous.

SUMMARY OF THE INVENTION

The present invention has been developed in light of the circumstances described above, and it is a primary object of the present invention to provide an image storage medium and manufacture method thereof, wherein for cases in which a blocking layer is provided above the stripe electrodes formed on the support body, there is no deterioration in the blocking performance of the blocking layer due to a forementioned surface-step, and further, even for cases in which stripe electrodes and sub-stripe electrodes have been formed alternating and parallel to each other and a blocking layer has been formed thereon, deterioration of the S/N ratio due to dark noise current emitted from the sub-stripe electrodes is prevented, and there is no deterioration in the blocking performance of the blocking layer due to aforementioned surface-step.

In accordance with a first aspect of the present invention, an image recording medium comprising a support body transparent to readout electromagnetic radiation, a first electrode layer (readout-side electrode layer) in which stripe electrodes having a plurality of line-shaped electrodes are disposed in a direction substantially perpendicular to the lengthwise direction of the support body, a readout photoconductive layer that exhibits conductivity upon being irradiated by readout electromagnetic radiation, a storage portion that stores a polarized charge of a latent image, a recording photoconductive layer that emits a polarized charge of a latent image and exhibits conductivity upon being irradiated by recording electromagnetic radiation, and a second electrode layer (recording-side electrode layer) that is transparent to recording electromagnetic radiation, superposed one on the other in that order, wherein between said readout photoconductive layer and said first electrode layer a blocking layer is provided that transmits said readout radiation and blocks injection of charges from each of said line-shaped electrodes, and which is provided so as to cover the top and side surfaces of each of said line-shaped electrodes in a continuous manner.

The expression "upper surface" refers to the surface of the readout photoconductive layer. In addition, the expression "side surface" refers to the two side surfaces of the line-shaped electrodes extending in the lengthwise direction. In this way, all exposed surfaces of each line-shaped electrodes are covered by the blocking layer.

Note that from the standpoint of blocking performance, as described above, it is sufficient if all exposed surfaces of each line-shaped electrode are covered by a blocking layer, however, from the standpoint of the manufacture thereof, it is acceptable if the blocking layer is also formed on the upper surface of the support body between each line-shaped electrode. In this case, the blocking layer is formed as a continuous layer that covers the upper and side of the line-shaped electrodes, and the upper surface of the support body.

Note that in accordance with a first aspect of the image storage medium of the present invention, each of aforementioned layers may be superposed one on the other in the order described above, or as described below, another layer such as a charge transport layer may be formed between aforementioned layers.

In accordance with a second aspect of the present invention, an image recording medium comprising a support body that is transparent to readout electromagnetic radiation, a first electrode layer having a first stripe electrode, formed of a plurality of line-shaped electrodes, that generates photoelectrical charges in the readout photoconductive layer upon irradiation thereof by said readout radiation and a second stripe electrode, that does not generate photoelectrical charges in the readout photoconductive layer upon irradiation thereof by said readout radiation, arranged alternating and substantially parallel, a readout photoconductive layer that exhibits conductivity upon irradiation thereof by said readout radiation, a storage portion that stores a latent-image polarized charge, a recording photoconductive layer that emits said latent-image polarized charge upon irradiation thereof by said recording radiation, and a second electrode layer transparent to said recording radiation, superposed on one another in this order, wherein between said readout photoconductive layer and said first electrode layer a blocking layer is provided that transmits said readout radiation and blocks injection of charges from each of said line-shaped electrodes.

Here, aforementioned "a first stripe electrode, formed of a plurality of line-shaped electrodes, that generates photo-electrical charges" is an electrode that transmits readout electromagnetic radiation and emits charges, and "a second stripe electrode, that does not generate photoelectrical charges" is an electrode that cuts off reading electromagnetic radiation and does not emit charges in the readout photoconductive layer, however it is not limited to being an electrode which perfectly cuts off all readout radiation and emits no charges at all, but can include electrodes that are marginally transparent to readout radiation and emit charges to a degree that causes no substantial problems. Accordingly, all the charges generated in the readout photoconductive layer are not exclusively due to electromagnetic radiation that has passed through the first stripe electrode, but some charges are generated in the readout photoconductive layer due to small amounts of electromagnetic radiation that passes through the second strip electrode as well.

In addition, the "blocking layer" of aforementioned image storage medium according to the second aspect of the present invention can be a blocking layer that covers the upper surface of each line-shaped electrode, or as in the image storage medium according to the first aspect of the present invention described above, can cover the entirety of the exposed surfaces (upper and side surfaces) of each line-shaped electrode. Further, the blocking layer can also be formed so as to cover the upper surface of the support body between each electrode. Still further, the material composing the blocking layer covering the upper surface and that covering the side surface do not have to be the same; several materials can be used, as long as they have the blocking property. Therefore, for example, blocking can be performed on the upper surface by a predetermined material, and on the side surface by a different material. Note that for the image storage medium according to the first aspect of the present invention as well, the blocking material of the upper surface and the blocking material of the side surface can be of different materials.

Note that for the image storage medium according to the first aspect of the present invention, each of the layers described above can be superposed one on the other in aforementioned order, or as described below, a charge transport layer or another such layer, etc. may be disposed between any of aforementioned layers.

Also, in addition to having the blocking property, it is preferable that the blocking layer of the image storage mediums according to the first or second aspect of the present invention: have a shock absorbing property enabling it to soften the heat stress due to the difference in heat expansion rates of the first electrode layer and the readout photoconductive layer; be provided so as to function to control crystallization of the interface between the first electrode layer and the readout photoconductive layer, and act as a reinforcing layer adhering between the first electrode layer and the readout photoconductive layer.

In addition, more specifically, it is desirable that the material used to form the blocking layer of the image storage mediums according to the first or second aspect of the present invention be a, polyamide, polyimide, polyester, polyvinyl butyral, polyvinyl pyrrolidone, polyurethane, polymethylmethacrylate, polycarbonate, etc. polymer having insulating properties, or a composite film formed of an organic binder and a lower molecule, etc. thin organic film material having transparency, good blocking properties and resiliency.

Further, the blocking layer can have a thickness of 0.05–5 $\mu$m, however, on the one hand, from the standpoint of serving as a buffer to heat stress, the 0.1–5 $\mu$m range is preferable, while on the other hand, from the standpoint of leaving no after-image, the range of 0.05–0.5 $\mu$m is preferable, and therefore it is desirable to strike a balance between these two factors and employ the range of 0.01–0.5 $\mu$m.

Still further, the manufacture method according to the present invention is the manufacture method for the image storage mediums in accordance with the first and second aspects of the present invention, characterized in that the blocking layer is formed by coating the line-shaped electrodes in the lengthwise direction with a blocking layer forming material.

Here, after the stripe electrodes have been formed on the glass or polymer support body, a dip method, a spray method, a bar coating method, or a screen coating method, for example can be employed when coating the line-shaped electrodes along the lengthwise direction thereof with the blocking layer forming material. In particular, through use of the dipping method, by merely dipping the support body having formed thereon the stripe electrodes in a solution and pulling it up and out of the solution repeatedly, even large sizes can be manufactured comparatively simply.

Because the blocking layer of the image storage medium according to the first aspect of the present invention is formed so that it extends continuously over the upper and side surfaces of the line-shaped electrodes, the readout photoconductive layer side of each line-shaped electrode can be completely covered, and injection of the dark current from the first electrode layer of the readout light injection side can be prevented with certainty.

Because a blocking layer is provided between the readout photoconductive layer and the first electrode layer in the image storage medium according to the second aspect of the present invention, not only injection of the dark current from the first stripe electrode, but also injection of the dark current from the second stripe electrode (the sub-stripe electrode) can be prevented.

In addition, if the blocking layer of the image storage mediums according to the first or second aspect of the present invention is formed of an insulating polymer material or a thin film organic material such as a composite film composed of an organic binder and a lower molecule organic material, by use of a simple method of coating the line-shaped electrodes along the lengthwise direction thereof with aforementioned organic polymer material, etc., the thin film can be formed so as to cover with certainty the entire exposed surface of each line-shaped electrode.

Further, according to the manufacture method of the image storage mediums according to the first and second aspects of the present invention, because the blocking layer is formed by coating the line-shaped electrodes along the lengthwise direction thereof with a blocking layer material, inconsistencies in the thickness of the blocking layer occur only in the area at both ends in the lengthwise direction of the line-shaped electrodes. Therefore, because the areas of the ends are normally non-image areas, any negative effect thereof can be avoided. In particular, according to the manufacture method of the image storage medium according to the second aspect of the present invention, even if the line-shaped electrodes are of a narrower width and the difference between the widths of the first stripe electrode and the second stripe electrode is of a large step, the blocking layer can still be easily formed so as to cover the entire exposed surface of each line-shaped electrode.

BRIEF DESCRIPTION OF THE DRAWINGS

FIGS. 1A and 1B are a perspective view and a cross-sectional view of a portion, respectively, of an electrostatic recording member implementing the present invention, FIG. 4A is a schematic view of an electrostatic latent image recording apparatus employing the electrostatic recording member of the present invention, and FIG. 4B is an integrated view of the electrostatic latent image obtaining apparatus.

DESCRIPTION OF THE PREFERRED EMBODIMENTS

Figure 2A:
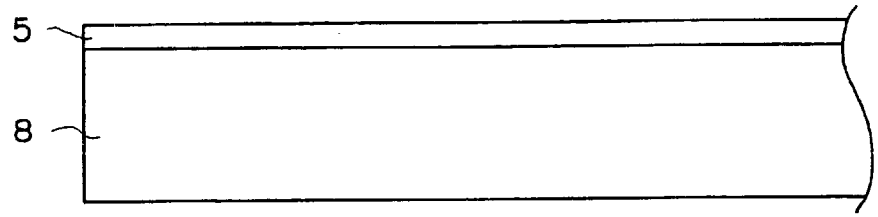
FIGS. 2A, 2B and 2C show a series of the manufacture of an electrostatic recording member according to the manufacture method of the present invention.
Figure 2B:
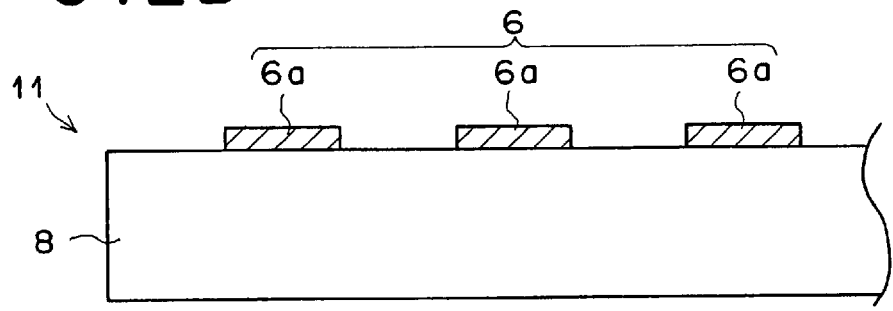
Figure 2C:
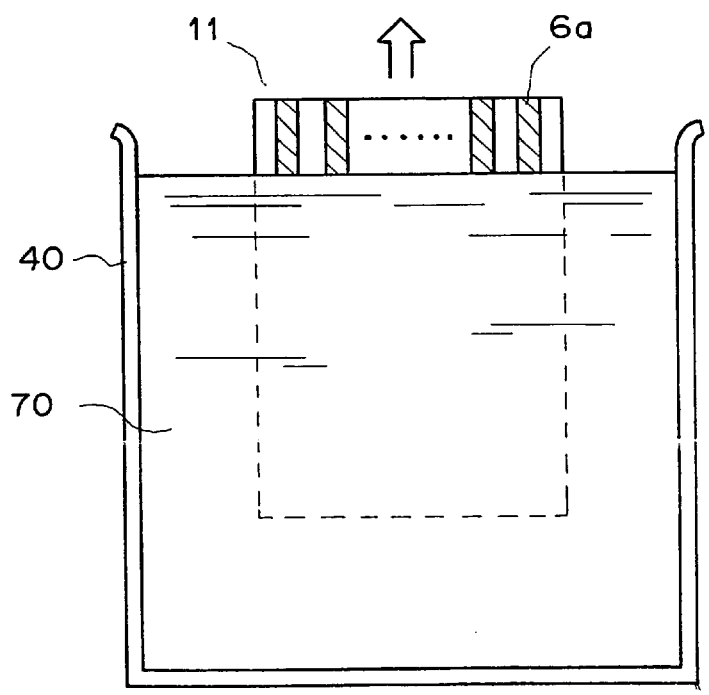

Hereinafter, with reference to the accompanying drawings, the preferred embodiments of the present invention will be explained. FIG. 1A is a schematic perspective view of the first preferred embodiment of a type of electrostatic recording member according to the image storage medium of the present invention, and FIG. 1B is a cross-sectional view of a portion thereof. FIGS. 2A, 2B and 2C show a series in the manufacture process thereof to an intermediate point.

Electrostatic recording member 10 of the first embodiment comprises a recording-side electrode layer 1 that is transparent to recording light (for example, X-ray, etc. radiation), a recording photoconductive layer 2 that exhibits conductivity upon irradiation by the recording light that has passed through recording-side electrode 1, a charge transport layer 3 that acts as a substantial insulator to the charge (latent-image polarized charge) placed on recording-side electrode land as a substantial conductor to a charge (transport polarized charge) of the reverse polarity of the latent-image polarized charge, a readout photoconductive layer 4 that exhibits conductivity upon irradiation thereof by readout light (for example, light in the blue spectrum in the 500 nm or below wavelength range), a blocking layer 7, a readout-side electrode layer 5 that is transparent to readout light, and a support body 8 that is transparent to readout light, superposed one on the other in that order. At the interface of recording photoconductive layer 2 and charge transport layer 3 is formed a storage portion 23 that stores the latent image polarized charge generated within recording photoconductive layer 2. Note that in each of the embodiments described below: a negative charge is placed on recording-side electrode 1 and a positive charge is placed on readout-side electrode 5; the latent-image polarized charge, which is a negative charge, is stored in storage portion 23 formed at the interface between recording photoconductive layer 2 and charge transport layer 3; and the mobility of the transport polarized charge, which is a positive charge in the reverse polarity with respect to the latent image polarized charge, which is a negative charge, is greater than that of the latent image polarized charge, whereby the electrostatic recording member is provided to function as a so-called hole transport layer.

When electrostatic recording member 10 is manufactured, the layers are formed (superposed) in the reverse order of that described above: readout-side electrode layer 5 is formed (superposed) on support body 8; after which, blocking layer 7, readout photoconductive layer 4, charge transport layer 3, recording photoconductive layer 2, and recording-side electrode layer 1 are formed (superposed) in that order.

In addition, the size (area) of electrostatic recording member 10 is for example, larger that 20×20 cm, and in particular, the size used for X-ray images is in the 43×43 cm range.

In addition to being transparent to readout light, support body 8 is capable of being transformed in shape in response to changes in the ambient temperature thereabout, and the heat expansion rate of support body 8 is within the range of ½ to ⅙ that of the material of which readout photoconductive layer 4 is formed; preferably, both are composed of materials having comparatively close heat expansion rates. As described below, because a-Se (amorphous selenium) is used for the readout photoconductive layer of the current embodiment and the heat expansion rate of Se is considered to be $3.68 \times 10^{-5}$/K (40° C.), a material having a more preferable heat expansion rate of $1.0–10.0 \times 10^{-5}$/K (40° C.), or a still more preferable heat expansion rate of $1.2–6.2 \times 10^{-5}$/K (40° C.) is to be used. An organic polymer material the can be transformed in shape, and has a heat expansion ratio within the range described above can be used.

As more specific examples of organic polymer materials, a polycarbonate having a heat expansion rate of $7.0–10.0 \times 10^{-5}$/K (40° C.), or a polymethylmethacrylate (PMMA) having a heat expansion rate of $5.0 \times 10^{-5}$/K (40° C.) can be used.

In this way, the heat expansion rates of support body 8, which serves as the base substrate, and readout photoconductive layer 4 (selenium film) can be matched, and under special environmental conditions, such as refrigerated conditions or during transport by ship, in which a cycle in which a large change in ambient temperature is undergone, no problems arising due to heat stress caused by differences in the respective heat expansion ratios between support body 8 and readout photoconductive layer 4 (selenium film), such as both support body 8 and readout photoconductive layer 4 peeling apart, readout photoconductive layer 4 tearing, or body 8 splitting, occur. Further, organic polymer substrate have the merit of being more support pact resistant compared to glass substrates.

Note that as described below, because blocking layer 7 can be provided so as to function also as a shock-absorbing layer, glass, for example, Corning 1737 at a 1.1 mm thickness having a heat expansion ratio of $0.378 \times 10^{-5}$/K (40° C.) can be used for support body 8.

Recording-side electrode layer 1 and readout photoconductive layer 5 can each be transparent to recording light, for example, along with Nesa film ($SnO_2$), ITO (Indium Tin Oxide), or the easily etchable IDIXO (Idemitsu Indium X-metal Oxide), which is an amorphous oxidized film and is transparent to light, Idemitsu Kosan Co., Ltd., etc., at a thickness of 50–200 nm can be employed.

Note that for cases in which images are to be recorded by using X-ray radiation as the recording light and irradiating the recording-side electrode layer 1 with said X-rays, because transparency to the visible light spectrum is not required, Al or Au, at a thickness of for example 100 nm can be used for recording-side electrode layer 1.

On the one hand, the electrodes of readout-side electrode 5 are stripe electrodes 6 comprising a plurality of elements 6a (line-shaped electrodes) arranged along the pixel pitch. In this case, there is no insulating material disposed between each element, blocking layer 7, which is the next layer, is superposed directly thereon, and readout-side electrode layer 5 is formed only of stripe electrodes 6.

Here, the objective of making the electrodes of readout-side electrode layer 5 stripe electrodes, as described below, correction of structure noise is simplified, by reducing the volume thereof the S/N ratio is improved, by localization of the electrostatic image corresponding to the stripe electrodes, the strength of the electric field is raised, readout efficiency and the S/N ratio are improved, and the readout time of required to carry out line readout (in the main scanning direction) is shortened.

Recording photoconductive layer 2 can exhibit conductivity upon irradiation thereof by recording light, and has as a main component including at least one of the photoconductive materials such as a-Se, an oxidized lead (II) such as PbO or iodized lead (II) such as $PbI_2$, $Bi_{12}$, $(Ge, Si) O_{20}$, $Bi_2I_3$/polymer nano-composite, etc., among which the quantum effect of a-Se vis-à-vis X-rays is high, and the dark resistance of a-Se is great, so a-Se is used.

It is preferable that the thickness of recording photoconductive layer 2 having a-Se as a main component be not less than 50 μm and not more than 1000 μm.

In charge transport layer 3, the larger the difference between the mobility of the negative charge placed on recording-side electrode layer 1 and the mobility of the positive charge of the reverse polarity thereto the better (for example $10^2$ or higher, and $10^3$ or higher is desirable),poly N-vinylcarboxyl (PVK), N,N'-diphenol-N,N'-bis (3-methylphenol) -<1,1'-biphenol>-4,4'-diamine (TPD) ordiscotechcrystal, etc. organic compounds, or a TPD polymer (polycarbonate, polycytelene, PUK) dispersions, a-Se doped with 10–200 ppm of CL, etc. semiconductor material can be applied. In particular, organic compounds (PVK, TPD, discotech crystals, etc.) are preferable because they are not sensitive to light, and also, because the dielectric constant is generally small, the volume of charge transport layer 3 and readout photoconductive layer 4 become smaller, and the effectiveness of signal uptake during reading can be increased. Note that the expression "are not sensitive to light" refers to things that exhibit almost no conductivity when irradiated with readout or recording light.

In addition, if for example, the mobility of a charge in the direction perpendicular to the thickness of a layer is greater than the mobility of a charge in the direction horizontal to the thickness of a layer, because the charge transport can be provided so that the transport polarized charges moving in the direction perpendicular to the layer thickness can move at a high speed, whereas movement in the direction horizontal thereto is difficult, and image clarity can be improved. More specifically, discotech crystals, hexapentyloxytriphenylene (refer to Physical Review, Letters 70.4, 1933), discotech crystal groups whose core contains a π conjugate fused ring or a transitional metal are appropriate.

In addition, charge transport layer 3 includes at least a first charge transport layer formed of a material that acts substantially as an insulator to the charge placed in recording photoconductive layer 2, that is, the charge of the same polarity of the latent image polarized charge, a second transport layer formed of a material that acts substantially as a conductor to the charge in the reverse polarity of that of the latent image polarized charge, that is, the transport charge. If the first charge transport layer is on the recording photoconductive layer 2 side and the second charge transport layer is on the readout photoconductive layer 4 side so as to form a stacked layer-type hole transport layer, because the first transport layer can be caused to have a strong insulating property with respect to the latent image polarized charge and the second charge transport layer can be caused to have a high-speed transporting property with respect to the transport polarized charge, as a charge transport layer, it can be ideal, having excellent after image and readout-speed responsiveness. More specifically, the thickness of the second charge transport layer can be thicker than that of the first charge transport layer, the first charge transport layer is a 0.1–1 μm thick layer formed of at least one of organic materials PVK or TPD, and the second charge transport layer is a 5–30 μm thick layer formed of a-Se doped with 10–200 ppm of CL.

In addition, comparing layers formed of TPD to layers formed of PVT: a layer formed of PVK has stronger insulating properties with respect to a charge of the same polarity as the latent image polarized charge (in the above example, a negative charge); and a layer formed of TPD has a stronger conducting property with respect to the transport polarized charge (in the above example, a positive charge) than that of a layer formed of PVK. A transport layer can be formed so that a layer composed of TPD is superposed on the readout photoconductive layer, and a layer composed of PVK is superposed on the recording photoconductive layer side.

Note that the configuration of the charge transport is not limited to two layers; it may comprise a plurality of layers, in which case, when superposing the layers, each of aforementioned qualities of each layer should be compared. The layer having the strongest insulating property with respect to the charge of the same polarity of the latent image polarized charge should be superposed on the recording photoconductive layer side, and the layer having the strongest conductive property with respect to the transport polarized charge should be superposed on the readout photoconductive layer side.

Readout photoconductive layer 4 should be composed of a material that exhibits conductivity upon being irradiated with readout light, having at least one of, for example, a-Se, Se—Te, Se—As—Te, non-metallic phthalocyanine, metallicphthalocyanine, MgPc (magnesium phtalocyanine), VoPc (phase II of vanadyl phtalocyanine), CuPc (cupper phtalocyanine), etc. photoconductive materials as a main component thereof.

In addition, if a photoconductive material having high sensitivity to the near ultraviolet to blue wavelength (300–500 nm) range of electromagnetic radiation, and low sensitivity to the red wavelength (700 nm or higher) range of electromagnetic radiation, more specifically, having as a main component thereof at least one of the following a—SE, PbI2, Bi12 (Ge,Si) O20, perylene bisimide (R=n-propyl), perylene bisimide (R=n-neopenthyl), because a readout photoconductive layer 4 that emits little dark current caused by heat due to a large bandgap, if electromagnetic radiation within the near UV to blue wavelength range is employed as the scanning light used when performing readout, the noise due to the dark current can be reduced.

Further, it is desirable that the combined total thickness of charge transport layer 3 and photoconductive layer 4 be ½ or less that of recording photoconductive layer 2, and the thinner said combined total thickness is (for example, ⅒ or less, or ¹⁄₂₀ or less), the better the readout-speed responsiveness.

In particular, it is preferable that a 0.05–0.5 μm thick layer of a=-Se is used, because an extremely high dark resistance is attained thereby.

In accordance with the above, in the current embodiment, readout photoconductive layer 4 is formed of a 0.05–0.5 μm thick layer having a-Se as a main component thereof.

Note that if a 5–30 μm thick layer composed of a-Se is switched for the 5–30 μm thick second whole transport layer composed of "a-Se doped with 10–200 ppm of CL" of charge transport layer 3, it can be formed in a combined structure with photoconductive layer 4. Also, in this case manufacture of electrostatic recording member 10 is comparatively simplified.

As shown in the drawings, between readout-side electrode layer 5 and readout photoconductive layer 4, a blocking layer 7 formed of a thin organic film that has blocking properties (blocking-wall potential), which is transparent to readout light and blocks charges injected from readout-side electrode layer 5, is provided. For cases in which blocking layer 7 is not provided, there is a portion of the charge (in this example, a positive charge) placed on readout-side electrode layer 5 (its electrodes) that is injected directly into readout photoconductive layer 4, said positive charge directly injected into readout photoconductive layer 4 moves into charge transport layer 3, where it recouples with the stored charge (latent image polarized charge) and the stored charge is thereby eliminated. Because elimination of the stored charge by said recoupling is not due to irradiation by readout light, it becomes a so-called noise component. On the one hand, for cases in which blocking layer 7 is provided, because of the blocking-wall potential, there is no injection of the positive charge placed on readout-side electrode layer 5 into readout photoconductive layer 4, and the noise caused by direct injection of the positive charge can be prevented.

In addition, as is well known, in the vapor deposition process employed when forming an amorphous selenium layer, interfacial crystallization progresses at the interface with another metal. In the electrostatic recording member 10 of the present invention as well, because readout photoconductive layer 4 is formed after readout-side electrode layer 5 has been formed on support body 8, interfacial crystallization progresses at the interface with the electrode material a-Se in the vapor deposition process by which readout photoconductive layer 4, charge transport layer 3, recording photoconductive layer 2, etc., whereby an increase in the injection of charges from the electrodes is caused and a problem arises in that the S/N ratio is lowered. When a transparent oxidized film is used as the material from which the electrodes are formed, and particularly when ITO is used, interfacial crystallization at the interface with a-Se is remarkable, as is the reduction of the S/N ratio. However, because electrostatic recording member 10 according to the present invention is provided with blocking layer 7 formed of a thin film of organic material between readout photoconductive layer 4 and readout-side electrode layer 5, said blocking layer 7 can function as a control layer with respect to interfacial crystallization with the a-Se: direct contact between the electrode material of readout-side electrode layer 5 and the a-Se of readout photoconductive layer 4 can be blocked; chemical change occurring at the interfaces with a-Se is prevented; and as a result, prevention of interfacial crystallization is attained. Therefore, there is no increase in the injection of charges from the electrodes, and the problem of deterioration of the S/N ratio due to interfacial crystallization is solved.

Further, in the current embodiment, a material having resiliency is used to form blocking layer 7, and blocking layer 7 functions as a shock-absorbing layer to cushion (hereinafter referred to as a heat-stress buffer) the heat stress between support body 8 and readout photoconductive layer 4. Note that it is also preferable that blocking layer 7 functions as a reinforcing layer adhering between readout photoconductive layer 4 and readout-side electrode layer 5.

If blocking layer 7 is provided with a heat-stress shock-absorbing function, because the heat stress between photoconductive layer 4 and support body 8 caused by the difference in heat expansion rates therebetween can be cushioned by the mechanical shock absorption of the stress by blocking layer 7, the material used to for support body 8 can be selected without consideration of the heat expansion rate of photoconductive layer 4. For example, if even glass is used, the mismatch of the heat expansion rates of the glass substrate that forms support body 8 and the a-Se layer that forms readout photoconductive layer 4 is compensated for by the heat-stress shock-absorbing effect of blocking layer 7, and even under special environmental conditions, no problems of ruptures due to differences in heat expansion occur.

Here, in order that blocking layer 7 be provided to function as a shock-absorbing layer as well, it is preferable that it be formed of a thin layer of organic material high in resiliency. The thin organic film to be used can be composed of, as disclosed in U.S. Pat. No. 4,535,468 for example, polyamide, polyimide, or polyester, polyvinyl butyral, polyvinyl pyrrolidone, polyurethane, polymethylmethacrylate, etc. thin film of an organic polymer that is transparent to readout light (for example, in the blue wavelength range) and has good hole blocking performance and insulation properties. Further, a thin composite film composed of an organic binder and approximately 0.3–3 percent of nigrosine, etc. low molecule organic material can also be used.

The thickness of the thin organic film can be in the 0.05–5 $\mu$m range, however, on the one hand, from the standpoint of heat-stress shock-absorption, a thickness in the 0.1–5 $\mu$m range is preferable, and on the other hand, from the standpoint of good performance in blocking after image formation, a thickness in the 0.05–0.5 $\mu$m is preferable; to strike a balance between these two factors, a thickness in the range of 0.1–0.5 $\mu$m is good.

When manufacturing electrostatic recording member 10, first, a layer of transparent oxidized film such as ITO or the easily etchable IDIXO, etc. is formed on support body 8 at a predetermined thickness (for example, 200 nm) and readout-side electrode 5 is formed (refer to FIG. 2A).

Then, after formation of the film of ITO, etc., photoetching, etc. processing is carried out and elements 6a are formed so as to compose stripe electrode 6 (refer to FIG. 2B). According to this method, a highly fine stripe pattern having a pixel pitch in the 50–200 $\mu$m range, appropriate for use in the medical field, for example, can be produced inexpensively.

Note that IDIXO forms an easily etchable film, and if IDIXO is used as the electrode material to form elements 6a, there is little fear that support body 8 will be melted during performance of the etching process, and the choice of materials that can be used to form support body 8 is widened.

Next, the material from which blocking layer 7, which is also to function as a shock-absorbing layer, is formed is coated onto elements 6a along the lengthwise direction thereof to form said blocking layer 7 at a predetermined thickness (for example, 200 nm). That is to say, said material is coated onto elements 6a along the lengthwise direction thereof at a predetermined thickness. When readout-side electrode layer 5 is formed in a flat shape, no problem regarding the coating direction, as a spin coating method, for example, can be employed to accomplish coating thereof, however, for the present invention, said spin coating method is not preferable.

Note that when coating elements 6a in the lengthwise direction thereof with blocking-layer forming material to form blocking layer 7, which also functions as a heat-stress shock-absorbing layer, after stripe electrode 6 has been formed on support body 8, for example, a dipping method, a spraying method, a bar coating method, a screen coating method, etc. in which the applying member, nozzle, brush, etc. is moved one-dimensionally can be used to carry out said coating.

FIG. 2C is a simple depiction of a sequence of the dipping method. In this dipping method: vat 40 is filled with blocking-layer forming liquid 70; member 11 comprising support body 8 on which stripe electrode 6 has been formed is dipped, along the lengthwise direction of elements 6*a*, into and pulled up and out of liquid 70. In this method, even for cases in which the size of member 11, that is, electrostatic recording member 10, is large, the operation can be accommodated by simple using a vat corresponding to the size thereof, and because the thickness of the layer can be controlled by simply repeating the dipping into and pulling up and out of operation, this method has the merit of being able to form a large layer at a desired thickness simply.

Figure 3A:
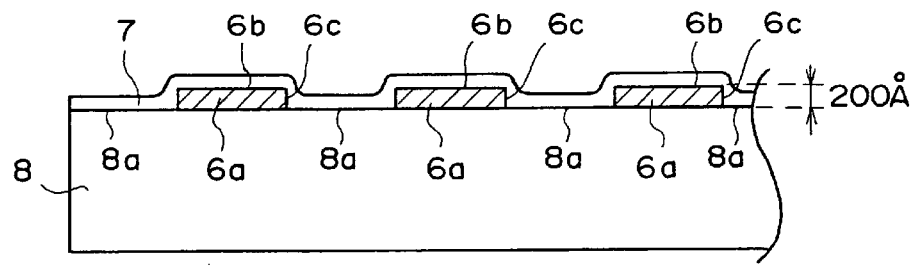
FIGS. 3A and 3B are cross-section views of an electrostatic recording member at an intermediate stage of the manufacture process.

FIG. 3A is a cross-sectional viewing showing the state in which blocking layer 7 has been formed by coating elements 6*a* along the lengthwise direction thereof with the blocking layer forming material. As shown in the figure, there is no discontinuity in blocking layer 7 at the edges of elements 6*a*: upper surfaces 6*b* and side surfaces 6*c* of elements 6*a* as well as the upper surface of support body 8 are well coated in a continuous manner, and the entire exposed surface of each element 6*a* is completely covered by blocking layer 7.

Figure 3B:
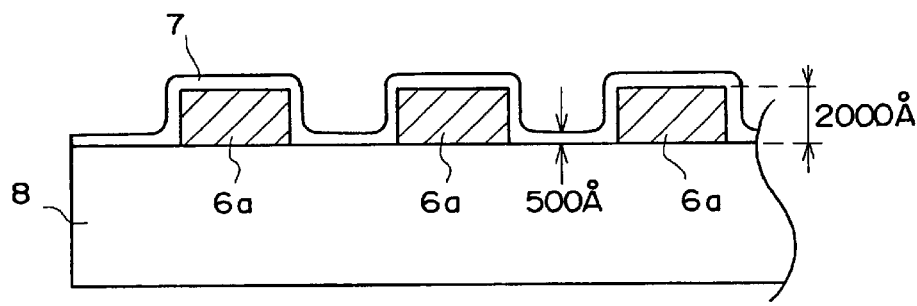

In addition, in order to make the resistance (line resistance) in the lengthwise direction of elements 6*a*, which are formed of a transparent oxidized film, small, the thickness of the transparent oxidized film is made comparatively thick (for example, 2000), and as shown in FIG. 3B, even for cases in which there is a large, steep edge-step, by coating elements 6*a* along the lengthwise direction thereof with organic polymer a continuous thin film with a thickness in the range 50–200 nm (0.05–0.2 $\mu$m) can be formed nicely, and good blocking performance obtained. Further, by repeated coating thereof, an additional thickness of 5 $\mu$m can be obtained.

Further, because blocking layer 7 can be provided so that it has a functions as a shock-absorbing layer, the heat stress between readout photoconductive layer 4 and support body 8 caused by the difference therebetween in heat expansion rates is cushioned, and even under special environmental conditions, no problems of rupturing due to the difference in heat expansion occur.

Figure 3C:
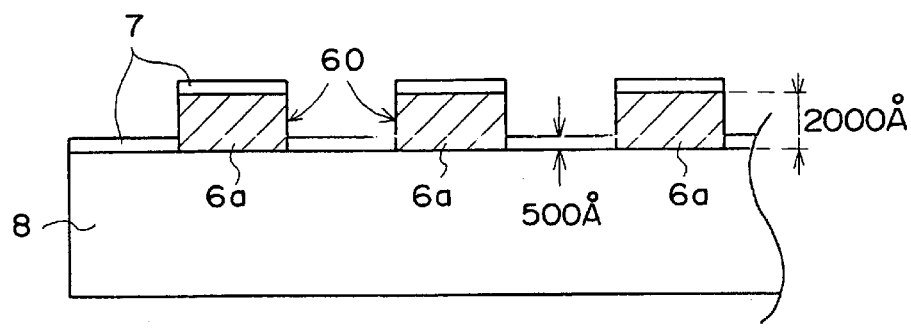
FIG. 3C is a cross-sectional view of a manufacture method other than that of the present invention.

Opposed to this, after a 2000 A thick layer of ITO has been formed, for cases in which a 500 A thick layer of $CeO_2$ is formed by resistance heat vacuum vapor deposition, as shown in FIG. 3C, because the edge step between elements 6*a* and support body 8 is large and steep, the blocking film formed of $CeO_2$ does not completely cover the edge, and the film of the state shown in FIG. 3B cannot be formed. Because of this, the edge portion of the blocking film is not formed and prevention of injection of a dark current from portion 60 shown in the middle of FIG. 3C cannot be prevented; blocking performance is deteriorated and a problem arises in that the S/N ratio is lowered. This problem inheres in that because the thicker elements 6*a* (readout-side electrode layer 5) are the larger the edge step becomes, so it becomes difficult to form a blocking layer that completely covers the edges, and the deterioration of blocking performance is remarkable.

Next, a simple explanation of the basic method by which image data recorded onto electrostatic recording member 10 as an electrostatic latent image is read out will be given. FIGS. 4A and 4B are schematic views of an electrostatic latent image recording apparatus employing aforementioned electrostatic recording member 10, and a convenient schematic view of the integrated electrostatic latent image recording and readout apparatuses, respectively. The recording and readout apparatuses are together referred to as a recording and readout system. Note that in the drawings, support body 8 has been omitted.

The recording and readout system comprises electrostatic recording member 10, recording light projecting means 90, power source 70, current detection circuit 80, which is composed of connection means S3 and detection amp 81, and readout light scanning means 93, wherein each element 6*a* is individually connected to detection amp 81, configured so that image data is obtained by scanning elements 6*a* along the lengthwise direction thereof (the sub-scanning direction) with a line-shaped light, which serves as the readout light, extended in the direction (the main scanning direction) perpendicular to the lengthwise direction of elements 6*a*. Note that the electrostatic latent image recording apparatus portion comprises electrostatic recording member 10, power source 70, recording light projecting means 90 and connecting means S3, and electrostatic latent image readout apparatus portion comprises electrostatic recording member 10, current detection circuit 80 and readout light scanning means 93.

Readout light scanning means 93 comprises substantially uniform line-shaped readout light L2 that is substantially perpendicular to elements 6*a* of readout-side electrode layer 5, and scans elements 6*a* along the lengthwise direction (the direction of the arrow in the middle of the figure) thereof. If electrostatic recording member 10 having stripe electrodes is used, because it is not necessary to scan with a laser beam or other spotlight, the configuration of the optical scanning system can be kept extremely simple and low cost. Also, because an incoherent light source can be used, interference fringe noise can be prevented.

Current detection circuit 80 comprises detection amp 81, which is connected to each element 6*a* of readout-side electrode layer 5, recording-side electrode layer 1 of electrostatic recording member 10 connected to one input side of connecting means S3 and the negative electrode of power source 70, and the positive electrode of power source 70 connected to the other input of connecting means S3. The output of connecting means S3 is connected in common to the uninvertable positive input terminal (+) of operating amp 81*a* constituting each detection amp 81. Each element 6*a* is individually connected to the uninvertable negative (−) input terminal of operating amp 81*a*. Detection amp 81 is a charge amp comprising operating amp 81*a*, integrating condenser 81*c*, and switch 81*d*. Note that detection amp 81 can comprise, for example, a current-voltage conversion circuit.

Figure 5A:
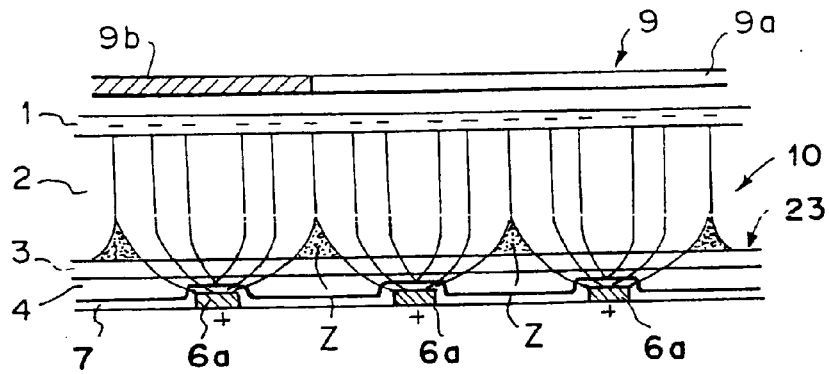
FIGS. 5A, 5B and 5C show the recording process of recording an electrostatic latent image onto the electrostatic image recording member of the present invention.
Figure 5B:
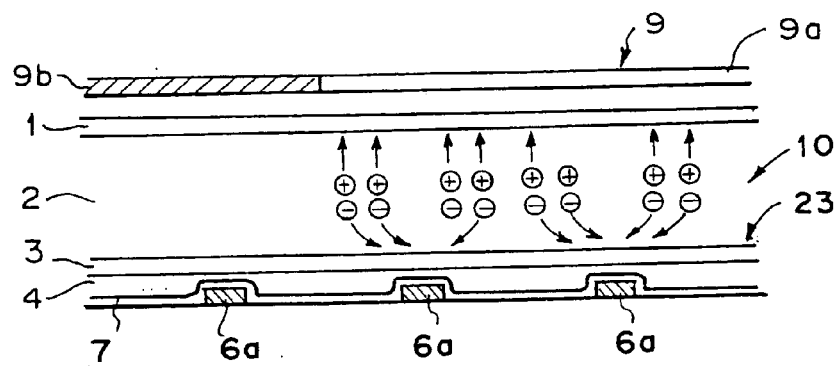
Figure 5C:
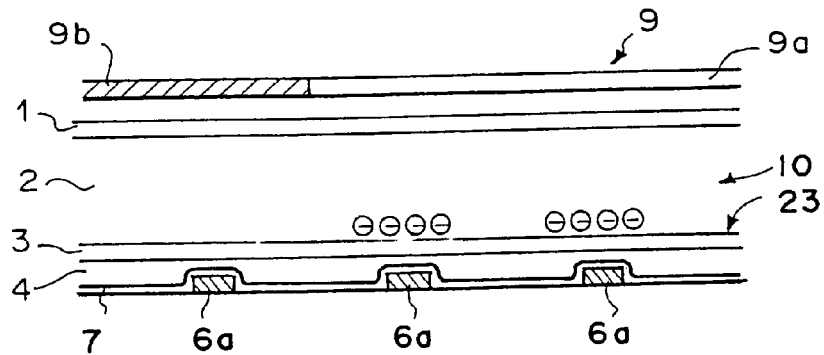

The process by which a electrostatic latent image is recorded on electrostatic recording member 10 will be explained with reference to the sidelong cross-sectional view of electrostatic recording member 10 shown in FIGS. 5A, 5B and 5C. Note that support body 8 has been omitted from the drawings.

Basically, the electrodes of readout-side electrode are the same as a flat electrode, however the way the charge in storage portion 23 is stored is slightly different. First, DC voltage I applied between recording-side electrode layer 1 and each element 6*a* of readout-side electrodes 5, and both electrode layers are charged. This causes a U-shaped field to be formed between recording-side electrode layer 1 and each element 6*a* of readout-side electrode 5, and although a substantially parallel field is present on a large area of recording photoconductive electrode layer 2, there are portions of the interface between said photoconductive layer 2 and charge transport layer 3 where there is no charge (refer to Z of FIG. 5A). To the extent that the combined total thickness of charge transport layer 3 and readout photoconductive layer 4 is thinner than the thickness of recording photoconductive layer 2, to the extent that the ratio between the width and pitch of elements 6a is small (favorable if 75% or less), and to the extent that the thickness of charge transport layer 3 and readout photoconductive layer 4 is substantially the same or less than the pitch of elements 6a, portions in which this kind of field are not present are clearly formed.

Next, recording light projecting means 90 is faced towards subject 9 and uniformly bombards said subject 9 with radiation rays L1. Radiation rays L1 pass through the transparent portion 9a of subject 9, and also through recording-side electrode layer 1. Recording photoconductive layer 2 receives radiation rays L1 that have passed through (the radiation rays that have passed through subject 9 become recording light), and electrons (negative charges; in this example, the latent image polarized charge) and holes (positive charges; in this example, the transport polarized charges) are formed corresponding to the quantity of radiation rays L1 (quantity of light) and conductivity is exhibited.

The positive charges among the positive and negative and negative charges occurring within recording photoconductive layer 2 move at a high speed toward recording-side electrode layer 1 within said photoconductive layer, and are recoupled, at the interface of recording-side electrode layer 1 and photoconductive layer 2, with the negative charges placed on recording-side electrode layer 1 and thereby eliminated. On the one hand, while being concentrated in elements 6a along the distribution of aforementioned U-shaped field, the negative charges occurring in photoconductive layer 2 move toward charge transport layer 3 (refer to FIG. 5B). Because charge transport layer 3 acts as an insulator to charges of the same polarity (for example, negative) as those of the latent image polarized charge placed on recording-side electrode layer 1, the negative charges moving within photoconductive layer 2 are stopped at storage portion 23 formed at the interface between photoconductive layer to and charge transport layer 3, and an electrostatic latent image is recorded mainly on elements 6a (refer to FIG. 5C). The quantity of the stored charged is determined by the quantity of the negative charge occurring within recording photoconductive layer 2, that is, by the quantity of radiation rays L1 that pass through subject 9. In addition, when the quantity of radiation rays L1 is small, the negative charges are pulled toward the center of elements 6a, and the stored charge becomes separated onto each element 6a. Further, because the stored charge is stored along the lined up elements 6a, by making the pitch (pixel pitch) of elements 6a narrow, a high clarity (degree of spatial resolution) electrostatic latent image can be recorded. Still further, by concentration of the electrical field toward elements 6a, readout efficiency is improved, and the S/N noise ratio can be raised. Because the vast strides that have been made in recent years in semiconductor manufacturing technology enable elements 6a to be easily formed having an adequately narrow interval, this type of electrostatic recording member can be easily manufactured. On the one hand, because radiation rays L1 do not pass through shielded portion 9b of subject 9, there is no change to the portion of electrostatic recording member 10 beneath the shielded portion 9b.

In this way, by bombardment of subject 9 with radiation rays L1, the charger corresponding to the image of the subject can be stored on the storage portion 23 formed at the interface of recording photoconductive layer 2 and charge transport layer 3. Note that the image of the subject carried stored latent image polarized charge is referred to as an electrostatic latent image. As made clear by the explanation given above, the apparatus of the present invention for recording an electrostatic latent image on electrostatic recording member 10 is of an extremely simple configuration, and the recording operation thereof is also extremely simple.

When performing readout of an electrostatic latent image recorded in this way, connecting means S3 is connected to the recording-side electrode layer 1 side of electrostatic recording member 10, and through an imaginary short-circuit of operating amp 81a, and the charge of both electrodes 1 and 5 of electrostatic recording member 10 are realigned to the same parity. Next, by readout light scanning means 93, elements 6a are scanned along the lengthwise direction thereof by line-shaped light L2. Readout light L2 passes through readout-side electrode layer 5, and readout photoconductive layer 4 irradiated by readout light L2 exhibits conductivity corresponding to said scanning. In the same way that conductivity is exhibited in recording photoconductive layer 2 by the occurrence of positive and negative charges therein upon irradiation thereof by radiation rays L1, exhibition of conductivity by readout photoconductive layer 4 is dependent upon the occurrence of positive and negative charges due to irradiation by readout light L2.

An extremely strong field is formed between storage portion 23 (the interface of recording photoconductive layer 2 and charge transport layer 3), in which the latent image polarized charge is stored, and elements 6a, corresponding to the combined total thickness of readout photoconductive layer 4 and charge transport layer 3 and the quantity of the latent image polarized charge. Here, because charge transport layer 3 acts as a conductor of the transport polarized charge (in this example, a positive charge), the positive charge occurring in readout photoconductive layer 4 is pulled by the latent image polarized charge stored in storage portion 23 and moves rapidly toward the center of charge transport layer 3, where it is recoupled with the latent image polarized charge stored in storage portion 23 and eliminated. On the one hand, the negative charge occurring in readout photoconductive layer 4 is recoupled with the positive charge occurring in readout-side electrode layer 5 and eliminated. Photoconductive layer 4 is scanned by an adequate quantity of reading light L2 and the latent image polarized charge stored in storage portion 23 and carrying the electrostatic latent image is completely eliminated by recoupling of the charges. In this way, "elimination" of the charges stored in electrostatic recording member 10 refers to the flow of current caused by the movement of charges within electrostatic recording member 10.

Detection amp 80 is connected to electrostatic recording member 10, and by this current, integrating condenser 81c of detection amp 81, which is connected to each element 6a, is charged and a charge corresponding to the quantity of current flow is stored in integrating condenser 81c, and the voltage at both terminals of integrating condenser 81c rises. Accordingly, at each detection amp 81, by opening switch 81d when each pixel and pixel interval is scanned and causing the charge stored in integrating condenser 81c to be released, a change in voltage at both terminals of integrating condenser 81c corresponding to the stored charge of each pixel is observed. Because this change in voltage corresponds to the charge stored in electrostatic recording member 10 of each pixel, by detection of the change in voltage, the electrostatic latent image can be read out.

In this way, if elements 6a are scanned along the lengthwise direction thereof with line-shaped readout light L2 and the electrostatic latent image is read out from electrostatic recording member 10, individual detection amps 81 obtain image signal in a linear sequence along the scanning direction, and the readout time can be shortened.

Note that if the combined total thickness of readout photoconductive layer 4 and charge transport layer 3 (the sum of the thickness of both) is comparatively thinner than recording photoconductive layer 2, because the thinner it is the more rapidly charges can be moved, high-speed readout can be carried out. Also, if the mobility of negative charges occurring in charge transport layer 3 is sufficiently less (for example, $10^3$ or less) than the mobility of positive charges, the storability of the stored charge is improved, and the preservability of the electrostatic latent image is improved.

In addition, because readout-side electrode layer 5 is formed of stripe electrodes, the volume of distribution by charge transport layer 3 and readout photoconductive layer 4 becomes small; it becomes difficult for detection amp 81 to be effected by noise, and because even if there are a few pixels affected by noise, they can be fixed by the element interval (the pixel pitch), image data can be matched to the disposition of elements 6a and corrected, and structure noise can be corrected with precision.

Further, elements 6a of readout-side electrode layer 5 and the latent image polarized charge are pulled together, and according to that electric field, it becomes easy for the transport polarized charge generated through irradiation by readout light to delete the latent image polarized charge, and even during readout, it is possible to maintain a high degree of clarity. This effect is particularly high when the quantity of light during recording is low (that is, when the quantity of the stored charge is small). If the space between elements 6a is provided with a cutoff property with respect to the readout light, the degree of clarity can be improved a level.

Still further, because the strength of the electric field of readout photoconductor 4 becomes strong in the vicinity to the sides of elements 6a, charges are generated within this strong field through irradiation by readout light L2, the efficiency of dissociation of exiting ions is raised, and because it is possible for the quantum efficiency of the generation of charges to approach 1, readout efficiency is improved, the S/N ratio is raised, and the density of light energy is decreased. The volume of charge transport layer 3 and readout photoconductive layer 4 can be further decreased, and efficiency of signal uptake during readout can be greatly improved.

As described above, in the configuration of the storage layer of the image storage medium disclosed in U.S. Pat. No. 4,535,468, because of the difficulty of forming the stripe electrode at the final process of the manufacture thereof, it was difficult to attain the effects of the present invention described above, and the significance of the formation of the readout-side electrode layer from the support body applied in the electrostatic recording member according to the present invention is large.

Also, if in addition to providing the space between elements 6a with a cutoff property with respect to readout light L2, shielded portion s and transparent portions are provided at predetermined intervals along the lengthwise direction (the scanning direction) of elements 6a, a portion that corresponds to the so-called drainboard eye as a portion that is transparent to readout light. In this way, deterioration of resolution due to leaking of light along the lengthwise direction of elements 6a during readout from the adjacent portion transparent to the readout light can be avoided, and the scanning exposure light becomes a substantially small spot beam scanned along a line, and even without tightly focusing readout light 12, a readout image with a high degree of clarity can be obtained.

Figure 6A:
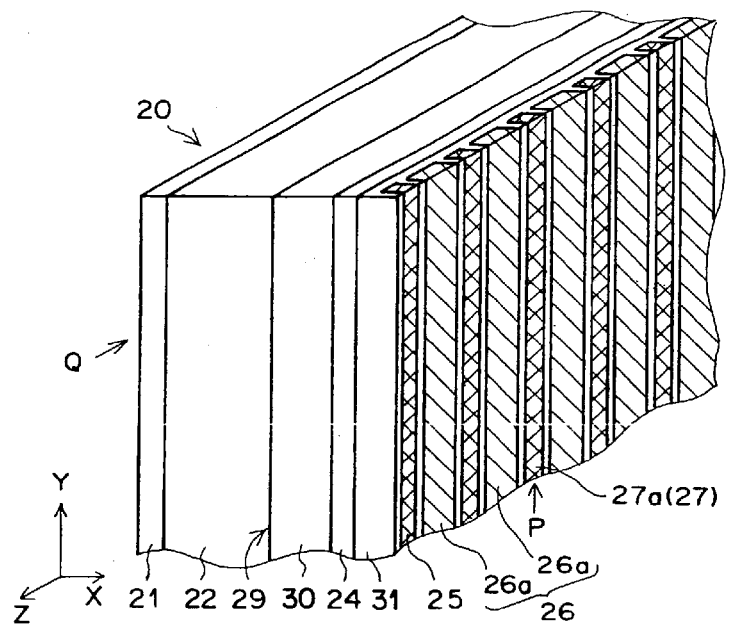
FIG. 6A is a perspective view of the electrostatic recording member according to the second embodiment of the present invention.
Figure 6B:
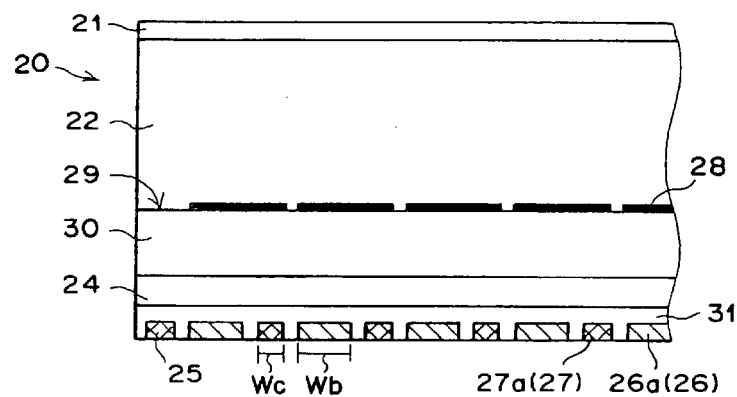
FIG. 6B is a cross-sectional view along the line X, Y indicated by arrow Q.
Figure 6C:
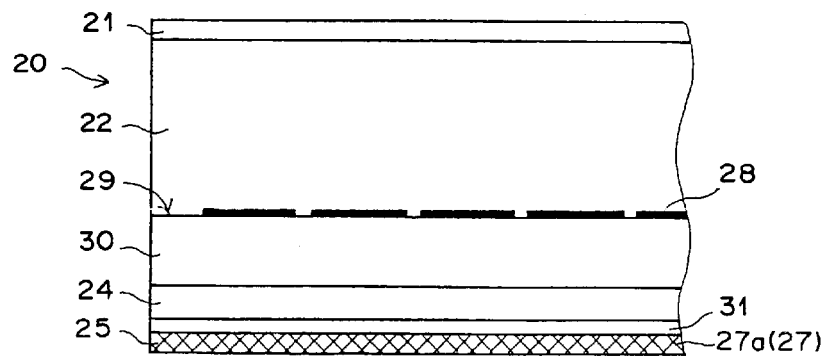
FIG. 6C is a cross-sectional view along the line X, Y indicated by arrow P.

Next, a second preferred embodiment of the image storage medium according to the present invention will be explained with reference to FIGS. 6A, 6B and 6C. FIG. 6A is a perspective view of electrostatic recording member 20, FIG. 6B is a cross-sectional view along the line X,Z indicated by arrow Q, and FIG. 6C is a cross-sectional view along the line X,Y indicated by arrow P.

Electrostatic recording member 20 comprises recording-side electrode layer 21, recording photoconductive layer 22, charge transport layer 30, readout photoconductive layer 24, blocking layer 31, readout-side electrode layer 25, and a support body that is transparent to readout light (not shown), superposed one on the other in that order. Aside from readout-side electrode layer, each layer is the same as that of electrostatic member 10 of the first embodiment. In addition, a plurality of discrete type microplates 28 are disposed so that there is an interval between adjacent microplates in storage portion 29, which is the interface between recording photoconductive layer 22 and charge transport layer 30.

Readout-side electrode layer 25 comprises stripe electrode 26 formed of a plurality of elements 26a (line-shaped electrodes) disposed in a stripe shape, and sub-stripe electrode 27 formed of a plurality of elements 27a disposed in a stripe shape. Each element 26a and 27a is disposed so that elements 26a and 27a alternate. A portion of blocking layer 31 is disposed between each element and stripe electrode 26 and sub-stripe electrode 27 are electrically insulated. Sub-stripe electrode 27 is a conducting member for outputting an electrical signal corresponding to the quantity of the latent image charge stored in storage portion 29 formed substantially at the interface of recording-side electrode layer 22 and charge transport layer 30.

In addition, although sub-stripe electrode 27 is coated with Al, Cr or another metal and is provided with a cutoff property with respect to readout light L2, within readout photoconductive layer 24 corresponding to elements 27a, a small charge is generated due to the small amount of readout light that passes through elements 27a.

The length of each side of microplates 28 is substantially equal to the pitch at which elements 26a are disposed, that is, microplates 28 are provided at a dimension substantially equal to the smallest pixel pitch for which resolution is possible; not only directly above elements 26a of stripe electrode 26, but extending to directly above elements 27a of sub-stripe electrode 27. In this way, the latent image charge stored above microplate 28 normally maintains the same polarity, free movement thereof above microplate 28 is possible, and performance of release of the charge during readout becomes good. Note that microplate 28 is disposed so that the center thereof is directly above elements 27a, and concentration of the charge on the perimeter of the pixels can be improved a level.

Microplate 28 can be formed from an extremely thin layer formed by use of a vacuum vapor deposition or a chemical buildup method to accumulate on a dielectric layer, for example, a single metal such as gold, silver, aluminum, chrome, copper, chrome, titanium, platinum, etc., or an alloy such as oxidized indium, etc. Said microplate 28 can be built up as a continuous layer, which is then subjected to an etching process and formed into discrete individual microplates having a dimension the same as the smallest pixel for which resolution is possible. This microplate can be made using a laser ablation, photo etching, etc. fine optical processing technology (refer to "Image processing & Amp; Materials" "Imaging for Microfabrication" of Chapter 18, J. M. Shaw, IBM Watson Research Center).

Blocking layer 31 is formed of the same material and in the same direction as that of the first embodiment, however, in addition to the same functions of the blocking layer of the first embodiment, it is also provided to function to prevent offset noise in storage portion 29 caused by accumulation of dark current noise generated at the edge of sub-stripe electrodes 27.

Figure 7A:
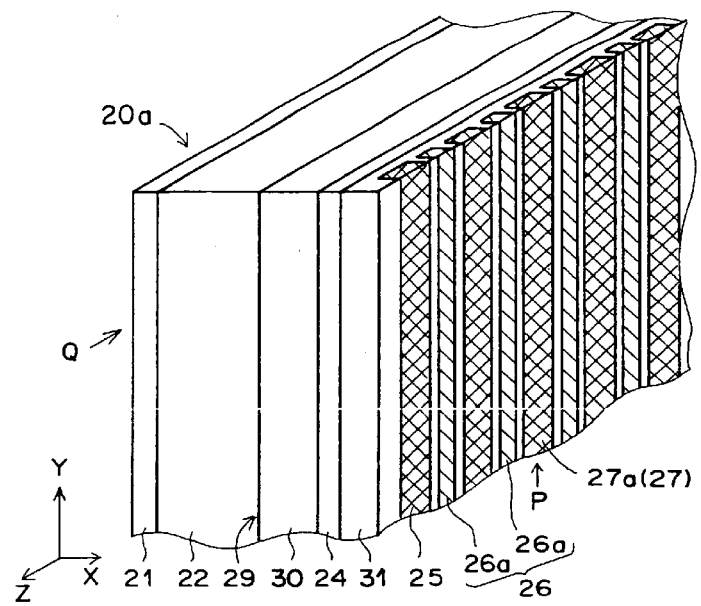
FIG. 7A is a perspective view of the electrostatic recording member according to the third embodiment of the present invention.
Figure 7B:
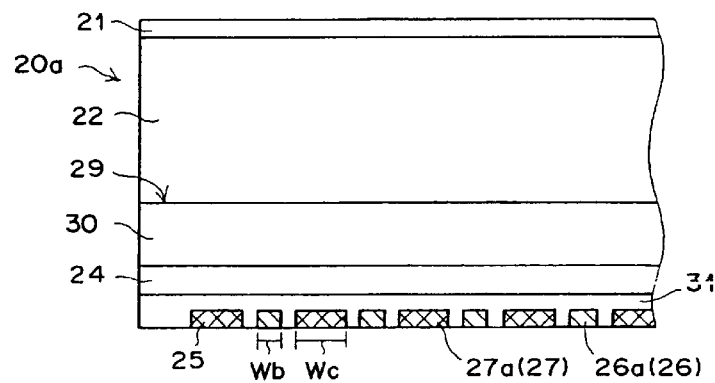
FIG. 7B is a cross-sectional view along the line X, Y indicated by arrow Q.
Figure 7C:
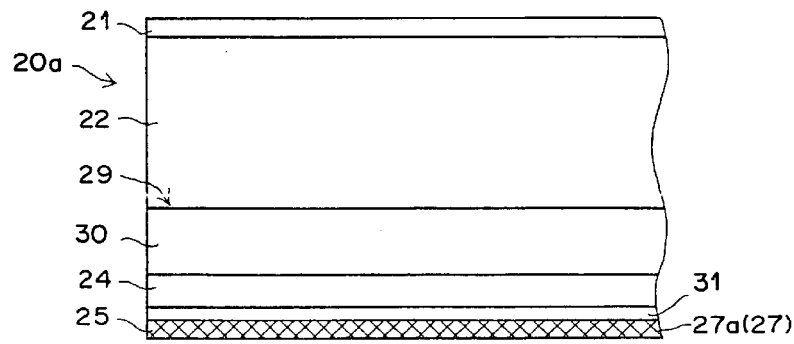
FIG. 7C is a cross-sectional view along the line X, Y indicated by arrow P.

FIGS. 7A, 7B and 7C are schematic views of the configuration of the electrostatic recording member according to a third preferred embodiment of the present invention. FIG. 7A shows a perspective view, FIG. 7B shows a cross-sectional view along the line X,Z indicated by arrow Q, and FIG. 7C shows a cross-sectional view along the line X,Y indicated by arrow P. Note that in FIGS. 7A, 7B and 7C, the elements in common with electrostatic recording member 20 of the second embodiment shown in FIGS. 6A, 6B and 6C are labeled with the same reference numerals, and explanation thereof is omitted where not particularly necessary. Microplate 28 described above is excluded from the electrostatic recording member 20a of the third embodiment, and when recording, stripe electrode 26 and sub-stripe electrode 27 are connected and sub-stripe electrode 27 is actively employed in forming the electric field distribution.

Note that blocking layer 31 is formed from the same materials and according to the same methods as those in the first and second embodiments.

Figure 8A:
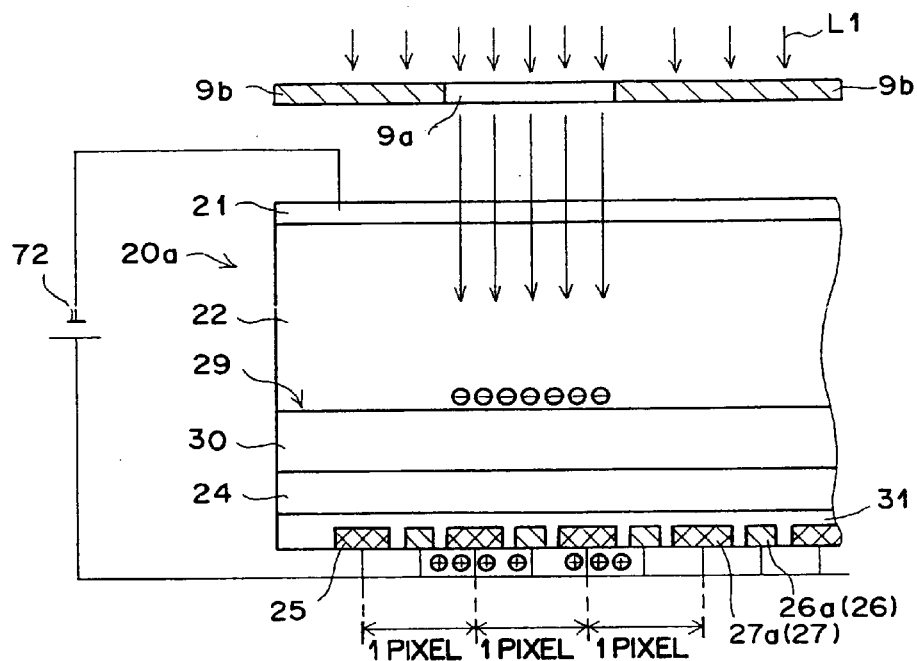
FIG. 8A shows a charge model of the process of recording an electrostatic latent image employing the latent image recording member according to the second embodiment of the present invention.
Figure 8B:
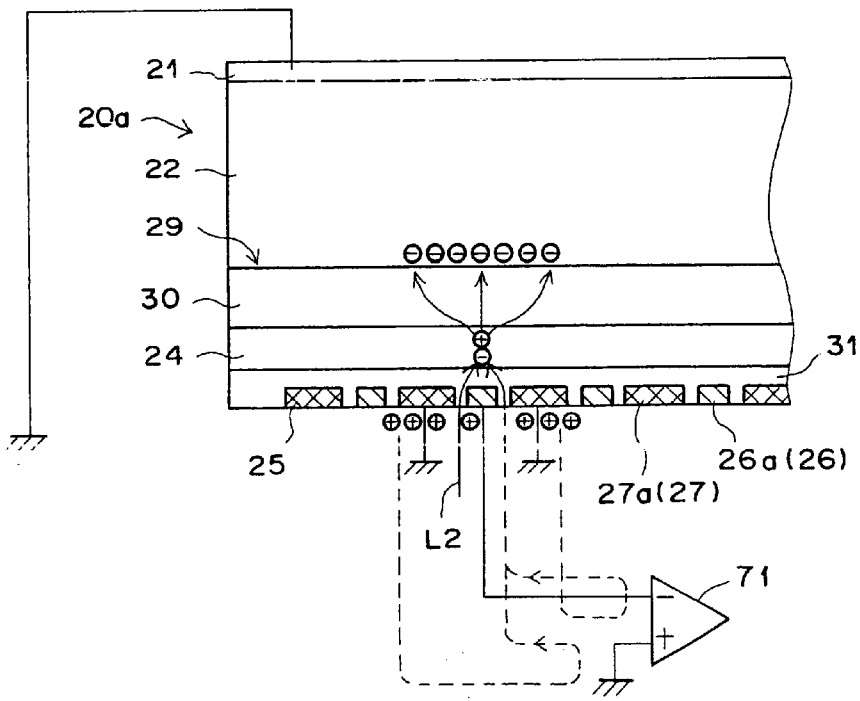
FIG. 8B shows a charge model of the process of obtaining an electrostatic latent image.

Next, a simple explanation of the method of recording an electrostatic latent image on electrostatic recording member 20a and readout thereof will be given. FIGS. 8A, 8B and 8C are schematic views of a recording and playback system implementing electrostatic recording member 20a.

This recording and readout system comprised electrostatic recording member 20a, recording light projecting means 90 (not shown), current detection circuit 71, which serves as the image signal obtaining means, and readout light scanning means 93 (not shown). Note that components that are the same as those of the first embodiment are likewise labeled, and where no particular further explanation thereof is required it has been omitted.

By reading out the charge of the latent image stored in storage portion 29, current detection circuit 71 obtains an electric signal of a level corresponding to the quantity of the latent image charge, and is provided with a plurality of operating amps (not shown), which are connected to each element 26a of stripe electrode 26.

If control voltage is applied to stripe electrode 26 and sub-stripe electrode 27 so as to cause them to be of the same polarity, the distribution of the electrical field formed between recording-side electrode layer 21 and readout side electrode layer 25 can be made uniform. In the current embodiment, during recording and readout, stripe electrodes 26 and sub-stripe electrodes 27 are in the ground polarity.

Next, in the recording and readout system described above, electrostatic recording member 20a records image data as an electrostatic latent image, and a further explanation of the readout method thereof will be given. First, explanation of the electrostatic image recording process will be given with reference to the charge model shown in FIG. 8A. Note that the negative and positive charges generated within photoconductive layer 22 are shown as a "−" or a "+", respectively, enclosed within a circle.

When recording an electrostatic image on electrostatic recording member 20a, DC voltage is applied between recording-side electrode layer 21 and stripe electrodes 26 and sub-stripe electrodes 27, whereby a charge is placed on both. Next, subject 9 is bombarded with radiation rays, and electrostatic recording member 20a is irradiated by recording light L1, which carries the radiation image data of the radiation rays that have passed through the transparent portion of subject 9. With this, positive and negative charges are generated within recording photoconductive layer 22 of electrostatic recording member 22, and these positive and negative charges move along aforementioned electric field distribution to storage portion 29. The negative charges generated at this time are stored on the corresponding positions of stripe electrodes 26 and sub-stripe electrodes 27.

On the one hand, the positive charges generated in recording photoconductive layer 22 move rapidly toward recording-side electrode layer 21, and are eliminated upon recoupling with the negative charges injected by power source 72 at the interface of recording-side electrode layer 21 and photoconductive layer 22. Further, because recording light L1 does not pass through the shielded portion of subject 9, no change whatsoever occurs in the portion of electrostatic recording member beneath shielded portion 9b.

In this way, by bombarding subject 9 with recording light L1, the charge corresponding to the image of the subject can be stored in the storage portion 29 formed at the interface of photoconductive layer 22 and charge transport layer 30. Because the quantity of the stored latent image charge (negative charge) is substantially proportionate to the quantity of radiation beams that have passed through subject 9 and entered electrostatic recording member 20a, the latent image charge carries the electrostatic latent image, and the electrostatic latent image is recorded on electrostatic recording member 20a.

Next, when readout of the electrostatic image from electrostatic recording member 20a is performed, recording-side electrode layer 21 is caused to be in the ground polarity, and the readout light scanning means is caused to move along the lengthwise direction of elements 26a, that is, by performing sub-scanning, the entire surface of electrostatic recording member 20a is scanned by line-shaped readout light L2. By this scanning by reading light L2, positive and negative charges, corresponding to the sub-scanning positions at which readout light L2 has entered, are generated within photoconductive layer 24.

Then, a portion corresponding to two elements 27a, that is, the latent-image charge of the space above both elements 27a is read out in order through elements 27a. That is to say, as shown in FIG. 8B, from element 26a positioned at the center of a pixel charge is released in the direction of the latent image charge corresponding to both adjacent elements 27a (in the space thereabove), and readout proceeds in this way. Note that in order to facilitate readout of more signal charges, it is favorable if the width of elements 27a is made wider than that of elements 26a.

In electrostatic recording member 20a, a condenser C*c is formed via readout photoconductive layer 24 and charge transport layer 30 between storage portion 29 and elements 27a. Note that even if sub-stripe electrodes 27 are provided, no substantial effect occurs to volume C*a of condenser C*a, which is formed via recording photoconductive layer 22 between electrode layer 21 and storage portion 29, and volume C*b of condenser C*b, which is formed via readout photoconductive layer 24 and charge transport layer 30 between stripe electrode 26 and storage portion 29.

Here, if we consider the volumes of condensers C*b and C*c, the ratio of volume C*b:C*c is the ratio of the width Wb:Wc of between each of elements 26a and 27a. By this, the volume Q+b of positive charges distributed to condenser C*b can be decreased relative to cases in which sub-stripe electrodes are not provided, and the quantity of current flowing to the outside from electrostatic recording member 20a can be increased relative to cases in which sub-stripe electrodes are not provided.

Figure 9A:
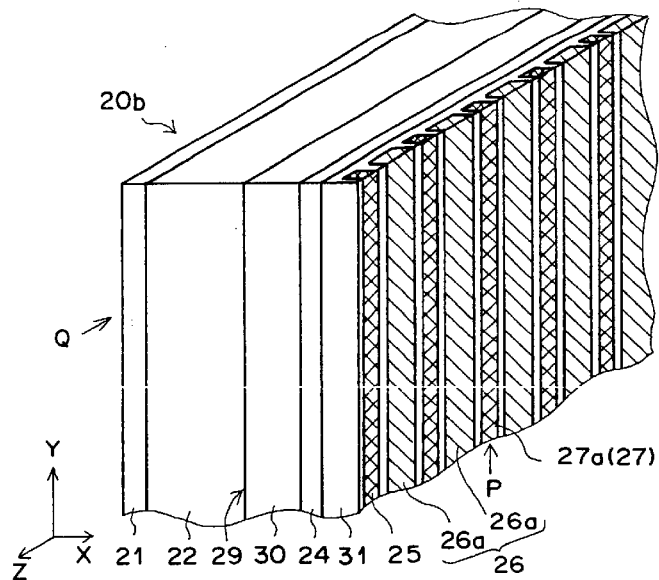
FIG. 9A is a perspective view of the electrostatic recording member according to the third embodiment of the present invention.
Figure 9B:
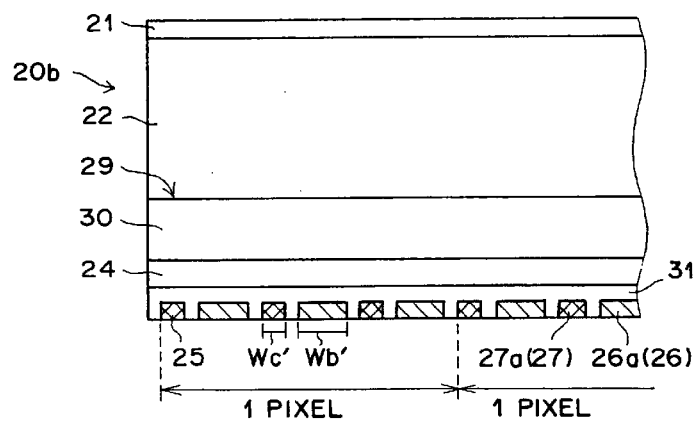
FIG. 9B is a cross-sectional view along the line X, Y indicated by arrow Q.
Figure 9C:
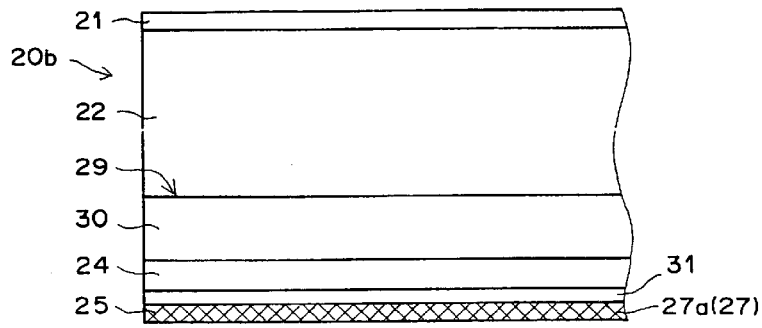
FIG. 9C is a cross-sectional view along the line X, Y indicated by arrow P.
Figure 10A:
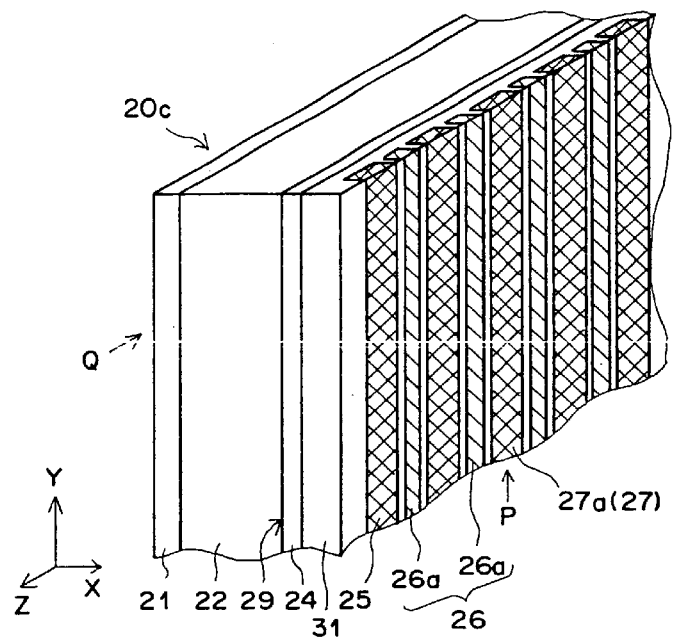
FIG. 10A is a perspective view of the electrostatic recording member according to the third embodiment of the present invention.
Figure 10B:
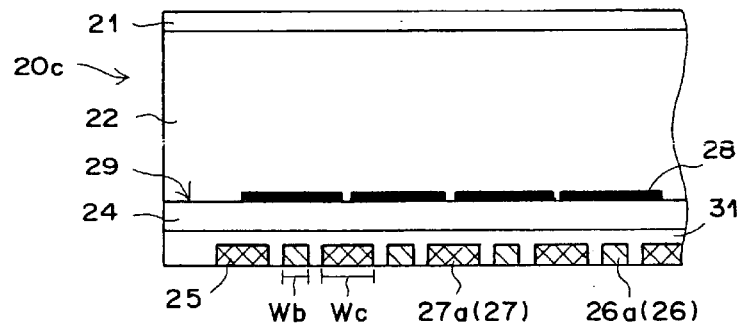
FIG. 10B is a cross-sectional view along the line X, Y indicated by arrow Q.
Figure 10C:
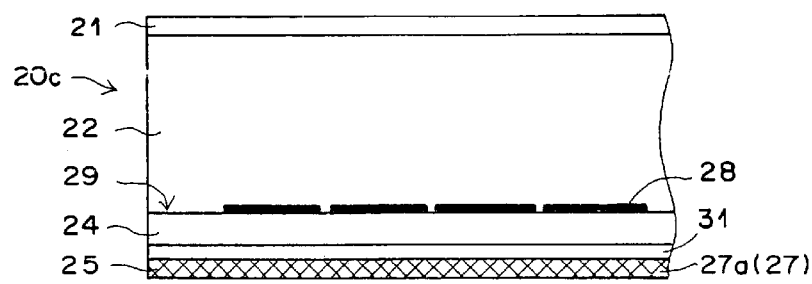
FIG. 10C is a cross-sectional view along the line X, Y indicated by arrow P.

FIGS. 9A, 9B and 9C are schematic views of the configuration of the electrostatic recording member according to a fourth preferred embodiment of the present invention. FIG. 9A shows a perspective view, FIG. 9B shows a cross-sectional view along the line X,Z indicated by arrow Q, and FIG. 9C shows a cross-sectional view along the line X, Y indicated by arrow P. Note that in FIGS. 9A, 9B and 9C, the elements in common with electrostatic recording member 20 of the second embodiment shown in FIGS. 6A, 6B and 6C are labeled with the same reference numerals, and explanation thereof is omitted where not particularly necessary. Microplate 28 of electrostatic recording member 20 described above is excluded from the electrostatic recording member 20b of the fourth embodiment, and within one pixel, elements 26a of stripe electrode 26 and elements 27a of sub-stripe electrode 27 are both provided alternating. In electrostatic recording member 20a shown in the drawings, within one pixel, three each of elements 26a and elements 27a are provided. When recording and readout are performed using electrostatic recording member 20b, one group of each of element 26a and element 27a can be handled per one pixel unit. If the pixel size of electrostatic recording members 20 and 20b are the same, the width of each element 26a and 27b, Wb' and Wc', respectively, of electrostatic recording member 20b is provided so as to be more narrow than that of widths Wb and We of electrostatic recording member 20 described above. With the advances in recent years in semiconductor forming technology, both elements 26a and 27a can be easily formed sufficiently narrow, and electrostatic recording member 20b can be easily manufactured.

Formed in this way, compared to electrostatic recording member 20a of the third embodiment described above, the ratio D1/D2 of distance D1 between storage portion 29 and electrode layer 25, and distance D2 between elements 26a and 27a can easily be made large. By this increased ratio, release of a charge from element 26a toward the latent image charge corresponding to both adjacent elements 27a thereto becomes better, and readout time can be made shorter than that of electrostatic recording member 20a of the third embodiment. This is particularly effective when microplate 28 is not provided.

Note that blocking layer 31 is formed from the same materials and according to the same methods as those in the first and second embodiments.

Preferred embodiments of the image storage medium and manufacture method thereof according to the present invention have been explained, however, the present invention is necessarily limited to the embodiments described above.

For example, in the explanation above, a negative charge was placed on the recording-side electrode layer and a positive charge on the readout-side electrode layer, and a negative charge was stored in the storage portion formed between the recording photoconductive layer and the charge transport layer, however, the present invention is not limited to this type of configuration: the polarity of each charge can be the reverse; when the polarity of the charges is reversed, only the minor change of providing the charge transport layer, which functioned as a hole transport layer, so that it functions as an electron transport layer suffices.

For example, the same photoconductive materials described above, such as a-Se, oxidized lead (II), iodized lead (II), etc. can be used as the recording photoconductive layer. A trinitrofluorenylidene-aniline (TNFA) dielectric body, trinitrofluorenone(TNF)/polyester dispersion, unsymmetrically substituted diphenoquinones, can be used for the charge transport layer. Non-metallic phthalocyanine or metallic phthalocyanine can be used for the readout photoconductive layer.

In addition, in the embodiments described above, the storage portion was formed between the recording photoconductive layer and the charge transport layer, however, the present invention is not limited to this configuration, and as described in for example, U.S. Pat. No. 4,535,468, the storage portion can be formed as a trap layer that traps and stores the latent image polarized charge.

In any of type of variation, stripe electrodes or stripe electrodes and sub-stripe electrodes comprising a plurality of elements are formed on a support body that is transparent to readout light, and a blocking layer is provided that transmits said readout radiation and blocks injection of charges from the elements, and which is provided so as to cover the top and side surfaces of each of the elements in a continuous manner, that is, the blocking layer must completely cover at least the entirety of the exposed surfaces of the line-shaped electrodes.

Note that the image storage medium in the embodiments described above has been premised on a support body transparent to readout electromagnetic radiation, a first electrode layer (readout-side electrode layer), a readout photoconductive layer that exhibits conductivity upon being irradiated by readout electromagnetic radiation, a storage portion that stores a latent image polarized charge generated by he recording photoconductive layer, a recording photoconductive layer that exhibits conductivity upon being irradiated by recording electromagnetic radiation, and a second electrode layer (recording-side electrode layer) that is transparent to recording electromagnetic radiation, superposed one on the other in that order, however, the image storage medium of the present invention can be an image storage medium that is not provided with each and every of these layers. If at least one photoconductive layer is formed on a support body transparent to readout light, it is possible to apply the content present invention described above thereto.

What is claimed is:

1. An image recording medium having a support body that is transparent to readout electromagnetic radiation, comprising a first electrode layer transparent to said readout radiation, in which the first electrode layer comprises a plurality of line-shaped electrodes, a readout photoconductive layer that exhibits conductivity upon irradiation thereof by said readout radiation, a storage portion that exhibits conductivity upon being irradiated by said readout radiation and which stores a latent-image polarized charge, a recording photoconductive layer that emits said latent-image polarized charge upon irradiation thereof by said recording radiation, and a second electrode layer transparent to said recording radiation, superposed on one another in this order, wherein between said readout photoconductive layer and said first electrode layer a blocking layer is provided that transmits said readout radiation and blocks injection of charges from each of said line-shaped electrodes, and which is provided so as to cover the top and side surfaces of each of said line-shaped electrodes in a continuous manner.

2. An image recording medium having a support body that is transparent to readout electromagnetic radiation, comprising a first electrode layer having a first stripe electrode, formed of a plurality of line-shaped electrodes, that generates photoelectrical charges in the readout photoconductive layer upon irradiation thereof by said readout radiation, and a second stripe electrode, that does not generate photoelectrical charges in the readout photoconductive layer upon irradiation thereof by said readout radiation, arranged alternating and substantially parallel, and a readout photoconductive layer that exhibits conductivity upon irradiation thereof by said readout radiation, and a storage portion that stores a latent-image polarized charge, and a recording photoconductive layer that emits said latent-image polarized charge upon irradiation thereof by said recording radiation, and a second electrode layer transparent to said recording radiation, superposed on one another in this order, wherein
between said readout photoconductive layer and said first electrode layer a blocking layer is provided that transmits said readout radiation and blocks injection of charges from each of said line-shaped electrodes.

3. An image storage medium as defined in claim 1 or 2, wherein said blocking layer comprises a thin film of organic material.

4. An image recording medium as defined in claim 3, wherein said film of organic material is composed of an organic polymer.

5. An image recording medium as defined in claim 4, wherein said film of organic material is a composite film composed of an organic binder and lower molecules.

6. A method of manufacturing an image storage medium comprising a support body transparent to readout electromagnetic radiation, a first electrode layer transparent to said readout radiation, in which the first electrode layer comprises a plurality of line-shaped electrodes, a blocking layer that transmits said readout radiation and blocks injection of charges from each of said line-shaped electrodes, a readout photoconductive layer that exhibits conductivity upon irradiation thereof by said readout radiation, a storage portion that stores a latent-image polarized charge, a recording photoconductive layer that emits said latent-image polarized charge upon irradiation thereof by said recording radiation, and a second electrode layer transparent to said recording radiation, superposed on one another in this order, wherein
said blocking layer is formed by coating said line-shaped electrodes in the lengthwise direction with a blocking layer forming material.

7. An image recording medium having a support body that is transparent to readout electromagnetic radiation, comprising a first electrode layer having a first stripe electrode, formed of a plurality of line-shaped electrodes, that generates photoelectrical charges in the readout photoconductive layer upon irradiation thereof by said readout radiation, and a second stripe electrode, that does not generate photoelectrical charges in the readout photoconductive layer upon irradiation thereof by said readout radiation, arranged alternating and substantially parallel, and a readout photoconductive layer that exhibits conductivity upon irradiation thereof by said readout radiation, and a storage portion that stores a latent-image polarized charge, and a recording photoconductive layer that emits said latent-image polarized charge upon irradiation thereof by said recording radiation, and a second electrode layer transparent to said recording radiation, superposed on one another in this order.

8. An image recording medium having a support body that is transparent to readout electromagnetic radiation, comprising a first electrode layer having a first stripe electrode, formed of a plurality of line-shaped electrodes, that is transparent to the readout electromagnetic radiation, and a second stripe electrode, formed of a plurality of line-shaped electrodes, that exhibits light blocking effect to said readout electromagnetic radiation, arranged alternating, a readout photoconductive layer that exhibits conductivity upon irradiation thereof by said readout radiation, a storage portion that stores a latent-image polarized charge, a recording photoconductive layer that emits said latent-image polarized charge upon irradiation thereof by said recording radiation, and a second electrode layer transparent to said recording radiation, superposed on one another in this order.

9. An image recording medium comprising:

a first electrode layer having a first stripe electrode, formed of a plurality of line-shaped electrodes, that generates photoelectrical charges in the readout photoconductive layer upon irradiation thereof by said readout radiation, and a second stripe electrode, that does not generate photoelectrical charges in the photoconductive layer upon irradiation thereof by said readout radiation, arranged alternating and substantially parallel, a readout photoconductive layer that exhibits conductivity upon irradiation thereof by said readout radiation, a storage portion that stores a latent-image polarized charge, a recording photoconductive layer that emits said latent-image polarized charge upon irradiation thereof by said recording radiation, and a second electrode layer transparent to said recording radiation, superposed on one another in this order.

10. An image recording medium comprising:

a first electrode layer having a first stripe electrode, formed of a plurality of line-shaped electrodes, that is transparent to the readout electromagnetic radiation, and a second stripe electrode, formed of a plurality of line-shaped electrodes, that exhibits light blocking effect to said readout electromagnetic radiation, arranged alternating, a readout photoconductive layer that exhibits conductivity upon irradiation thereof by said readout radiation, a storage portion that stores a latent-image polarized charge, a recording photoconductive layer that emits said latent-image polarized charge upon irradiation thereof by said recording radiation, and a second electrode layer transparent to said recording radiation, superposed on one another in this order.

11. An image recording medium as defined in claim 7, 8, 9 or 10, wherein a single line of pixels of the image recording medium comprises a single line of said first stripe electrode, and said second stripe electrode that is adjacent to said single line of the first stripe electrode.

12. An image recording medium as defined in claim 7, 8, 9 or 10, wherein a single line of pixels of the image recording medium comprises a plurality of said first stripe electrodes, and said second stripe electrodes, each of the second stripe electrode being adjacent to one of the plurality of the first stripe electrodes.

13. An image recording medium as defined in claim 7, 8, 9 or 10, wherein the storage portion is provided with a plurality of conductive members which extend above the first stripe electrode and the second stripe electrode, each conductive member being provided for each pixel of the image recording medium, and the latent image charge stored is maintained to be the same electric potential by the conductive member.

14. An image recording medium as defined in claim 7, 8, 9 or 10, wherein a charge transport layer that acts as a substantial insulator to the latent image charge and as a substantial conductor to a charge of the reverse polarity of the latent image charge is provided between the recording photoconductive layer and the readout photoconductive layer, and the storage portion is formed at the interface between the recording photoconductive layer and the charge transport layer.

15. An image recording medium as defined in claim 7, 8, 9 or 10, wherein a trap layer which traps and stores the latent image charge is provided between the recording photoconductive layer and the readout photoconductive layer, and the storage portion is formed inside the trap layer or at the interface between the trap layer and the recording photoconductive layer.

16. An image recording medium as defined in claim 7, 8, 9 or 10, wherein width of the first stripe electrode is wider than that of the second stripe electrode.

17. An image recording method comprising the steps of radiating recording electromagnetic radiation on the image recording medium as defined in claim 7, 8, 9 or 10, storing a charge corresponding to the amount of the recording electromagnetic radiation in a storage portion of the image recording medium as latent image charge, and recording information on an image in the storage portion as an electrostatic latent image, wherein the electric potential of the first stripe electrode is rendered substantially equal to that of the second stripe electrode, and the recording is carried out by charging DC voltage between the first electrode layer and the second electrode layer.

18. An image recording method for reading out the image from the image recording medium, in which image information is recorded as an electrostatic latent image, as defined in claim 7, 8, 9 or 10 further comprising the steps of rendering the electric potential of the first stripe electrode substantially equal to that of the second stripe electrode, and radiating the readout electromagnetic radiation with respect to the second electrode layer, thereby gaining an electrical signal corresponding to the quantity of the latent image charge stored in the storage portion.

* * * * *